United States Patent
Morihara et al.

(10) Patent No.: US 9,985,551 B2
(45) Date of Patent: May 29, 2018

(54) CAPACITOR MODULE AND MATRIX CONVERTOR

(71) Applicant: KABUSHIKI KAISHA YASKAWA DENKI, Kitakyushu-shi (JP)

(72) Inventors: Takayuki Morihara, Kitakyushu (JP); Takahiro Uchino, Kitakyushu (JP); Masahiro Tsuruta, Kitakyushu (JP); Shigekatsu Nagatomo, Kitakyushu (JP); Yuto Kubo, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 127 days.

(21) Appl. No.: 14/744,038

(22) Filed: Jun. 19, 2015

(65) Prior Publication Data
US 2015/0372609 A1 Dec. 24, 2015

(30) Foreign Application Priority Data

Jun. 23, 2014 (JP) ................................. 2014-127962

(51) Int. Cl.
*H02M 7/00* (2006.01)
*H05K 7/20* (2006.01)
*H02M 5/297* (2006.01)
*H01G 4/38* (2006.01)

(52) U.S. Cl.
CPC .............. *H02M 7/003* (2013.01); *H05K 7/20* (2013.01); *H01G 4/38* (2013.01); *H02M 5/297* (2013.01)

(58) Field of Classification Search
CPC ................................. H02M 7/003; H01G 4/38
See application file for complete search history.

(56) References Cited

U.S. PATENT DOCUMENTS

| 2002/0105068 | A1* | 8/2002 | Fukumoto | H01L 25/105 257/686 |
| 2006/0125086 | A1* | 6/2006 | Booth, Jr. | H01L 23/3672 257/706 |
| 2007/0109715 | A1* | 5/2007 | Azuma | B60K 6/28 361/299.3 |
| 2007/0246635 | A1* | 10/2007 | Nakajima | H05K 7/20927 248/637 |

(Continued)

FOREIGN PATENT DOCUMENTS

| CN | 106464145 | 2/2017 |
| JP | 2005-065357 | 3/2005 |

(Continued)

OTHER PUBLICATIONS

Japanese Office Action for corresponding JP Application No. 2014-127962, dated Sep. 12, 2016 (w/ English machine translation).

(Continued)

*Primary Examiner* — Binh Tran
*Assistant Examiner* — Douglas Burtner
(74) *Attorney, Agent, or Firm* — Mori & Ward, LLP

(57) ABSTRACT

A capacitor module applicable in a matrix convertor includes a module cover and a plurality of terminals. The module cover houses a plurality of AC capacitors. The plurality of terminals are disposed at least on a first side and a second side of the module cover in a widthwise direction of the module cover, and protrude from a bottom surface of the module cover.

26 Claims, 10 Drawing Sheets

(56) References Cited

U.S. PATENT DOCUMENTS

| | | | |
|---|---|---|---|
| 2008/0049476 A1* | 2/2008 | Azuma | B60L 3/12 363/131 |
| 2010/0025126 A1* | 2/2010 | Nakatsu | B60L 11/00 180/65.1 |
| 2010/0165680 A1* | 7/2010 | Yoshinaga | B60L 11/1803 363/123 |
| 2010/0277871 A1* | 11/2010 | Kitanaka | B60L 9/16 361/710 |
| 2011/0249421 A1* | 10/2011 | Matsuo | B60K 6/445 361/821 |
| 2011/0291236 A1* | 12/2011 | Hayashi | H01L 23/49537 257/532 |
| 2011/0299208 A1* | 12/2011 | Suzuki | H01L 23/4006 361/91.5 |
| 2012/0019970 A1* | 1/2012 | Nagano | H02M 1/34 361/91.7 |
| 2012/0020021 A1* | 1/2012 | Kishimoto | H02M 5/271 361/695 |
| 2012/0188807 A1* | 7/2012 | Takizawa | H02M 7/003 363/123 |
| 2012/0241953 A1* | 9/2012 | Yamada | H01L 23/4334 257/737 |
| 2013/0021759 A1* | 1/2013 | Zschieschang | H01L 23/3735 361/728 |
| 2013/0188404 A1* | 7/2013 | Nakamura | H02M 5/297 363/37 |
| 2013/0222967 A1* | 8/2013 | Imamura | H01G 2/04 361/301.3 |
| 2014/0126154 A1* | 5/2014 | Higuchi | B60L 11/1803 361/714 |
| 2014/0126263 A1* | 5/2014 | Koyano | H02M 5/293 363/148 |
| 2014/0185326 A1* | 7/2014 | Koyano | H02M 5/293 363/2 |
| 2014/0313806 A1* | 10/2014 | Shinohara | H05K 7/20927 363/141 |
| 2015/0221432 A1* | 8/2015 | Zhou | H02J 5/005 361/679.01 |
| 2015/0289391 A1* | 10/2015 | Nakatsu | H05K 5/0026 361/796 |
| 2016/0203915 A1* | 7/2016 | Nishiyama | H01G 4/30 363/131 |
| 2017/0077828 A1 | 3/2017 | Morihara et al. | |

FOREIGN PATENT DOCUMENTS

| | | |
|---|---|---|
| JP | 2005-237138 | 9/2005 |
| JP | 2012-029372 | 2/2012 |
| JP | 2012-029373 A | 2/2012 |
| JP | 2013-115907 | 6/2013 |

OTHER PUBLICATIONS

Chinese Office Action for corresponding CN Application No. 201510345063.5, dated Jul. 3, 2017.

* cited by examiner

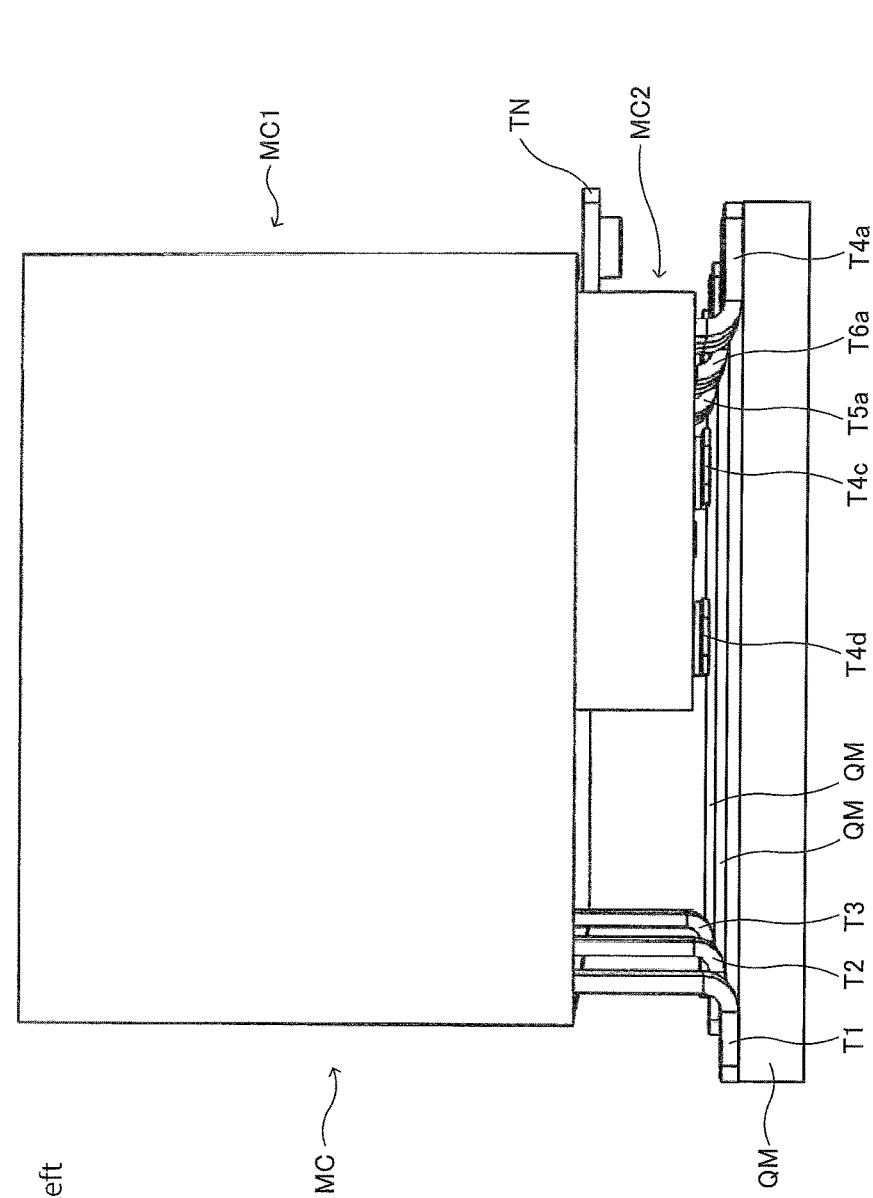

US 9,985,551 B2

CAPACITOR MODULE AND MATRIX CONVERTOR

CROSS-REFERENCE TO RELATED APPLICATIONS

The present application claims priority under 35 U.S.C. § 119 to Japanese Patent Application No. 2014-127962, filed Jun. 23, 2014. The contents of this application are incorporated herein by reference in their entirety.

BACKGROUND

Field of the Invention

The embodiments disclosed herein relate to a capacitor module and a matrix convertor.

Discussion of the Background

Japanese Unexamined Patent Application Publication No. 2012-29373 discloses a matrix convertor including a plurality of semiconductor switch modules and a plurality of AC (Alternating-Current) capacitor modules. Each of the semiconductor switch modules includes semiconductor bidirectional switches.

According to one aspect of the present disclosure, a capacitor module applicable in a matrix convertor includes a module cover and a plurality of terminals. The module cover houses a plurality of AC capacitors. The plurality of terminals are disposed at least on a first side and a second side of the module cover in a widthwise direction of the module cover, and protrude from a bottom surface of the module cover.

According to another aspect of the present disclosure, a matrix convertor includes a plurality of first bidirectional switches, a plurality of second bidirectional switches, and capacitor modules. The plurality of first bidirectional switches are respectively coupled to input phases of an AC power source, and are respectively coupled to output phases of a load. The plurality of second bidirectional switches are respectively coupled to the input phases of the AC power source, and are respectively coupled to the output phases of the load. The plurality of second bidirectional switches are coupled electrically in parallel to the plurality of first bidirectional switches. The capacitor modules are respectively disposed on the plurality of first bidirectional switches and on the plurality of second bidirectional switches. The capacitor modules each include a module cover and a plurality of terminals. The module cover houses a plurality of AC capacitors. The plurality of terminals are disposed at least on a first side and a second side of the module cover in a widthwise direction of the module cover, and protrude from a bottom surface of the module cover.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein:

FIG. 10 is a schematic diagram illustrating a freestanding state of the capacitor module.

DESCRIPTION OF THE EMBODIMENTS

Figure 1:
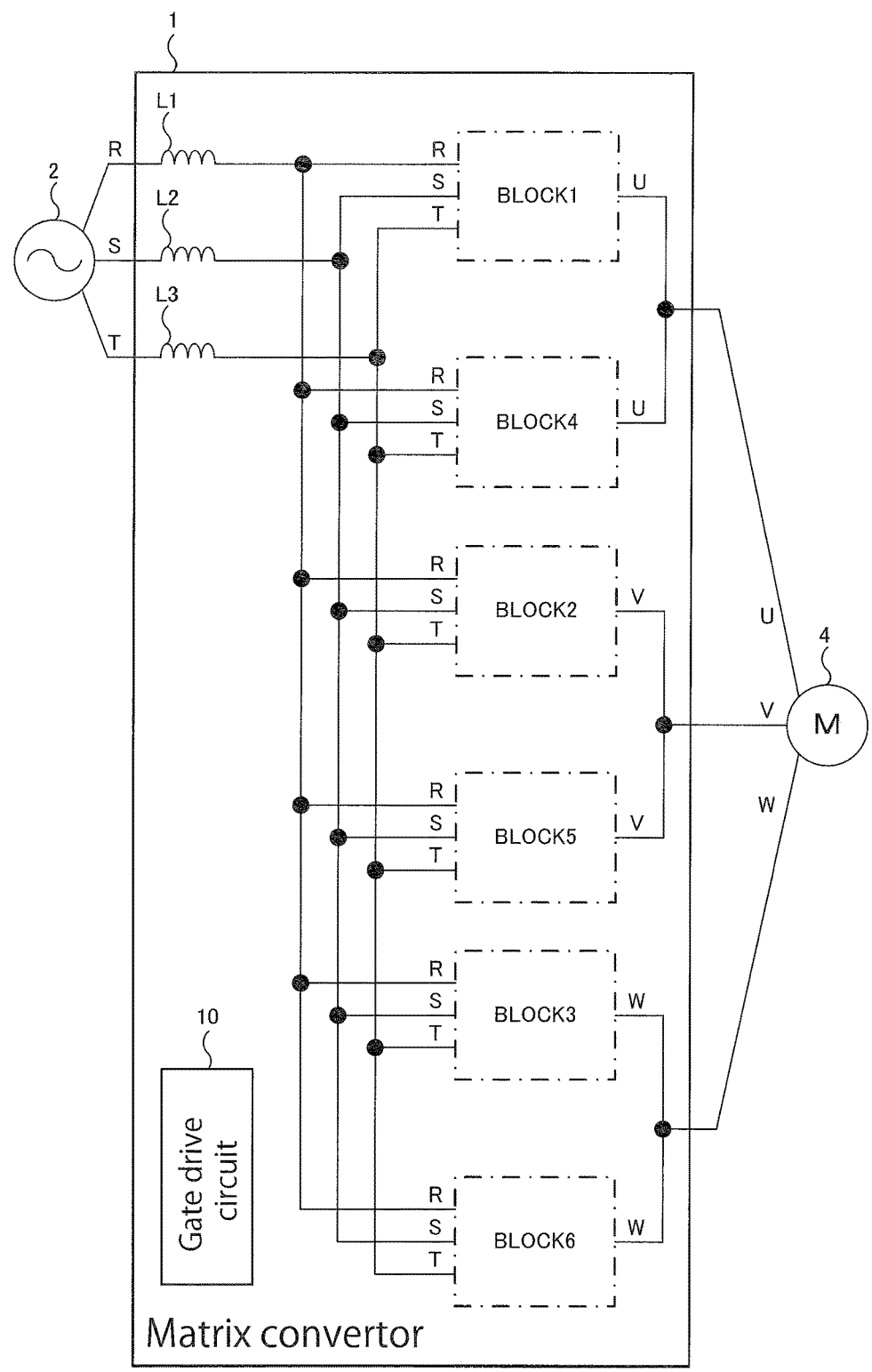
FIG. 1 is a circuit diagram illustrating a circuit configuration of a matrix convertor according to an embodiment.

The embodiments will now be described with reference to the accompanying drawings, wherein like reference numerals designate corresponding or identical elements throughout the various drawings.

Some of the drawings are provided with the directional notations "front", "rear", "left", "right", "upward", and "downward". These directional notations respectively correspond to the directional notations "front", "rear", "left", "right", "upward", and "downward" mentioned in the specification. It is noted, however, that the positional relationship between the components of the matrix convertor according to the embodiment will not be limited to the concept of "front", "rear", "left", "right", "upward", and "downward".

(Circuit Configuration of Matrix Convertor)

First, by referring to FIGS. 1 to 3, a circuit configuration of the matrix convertor according to this embodiment will be described.

Figure 2:
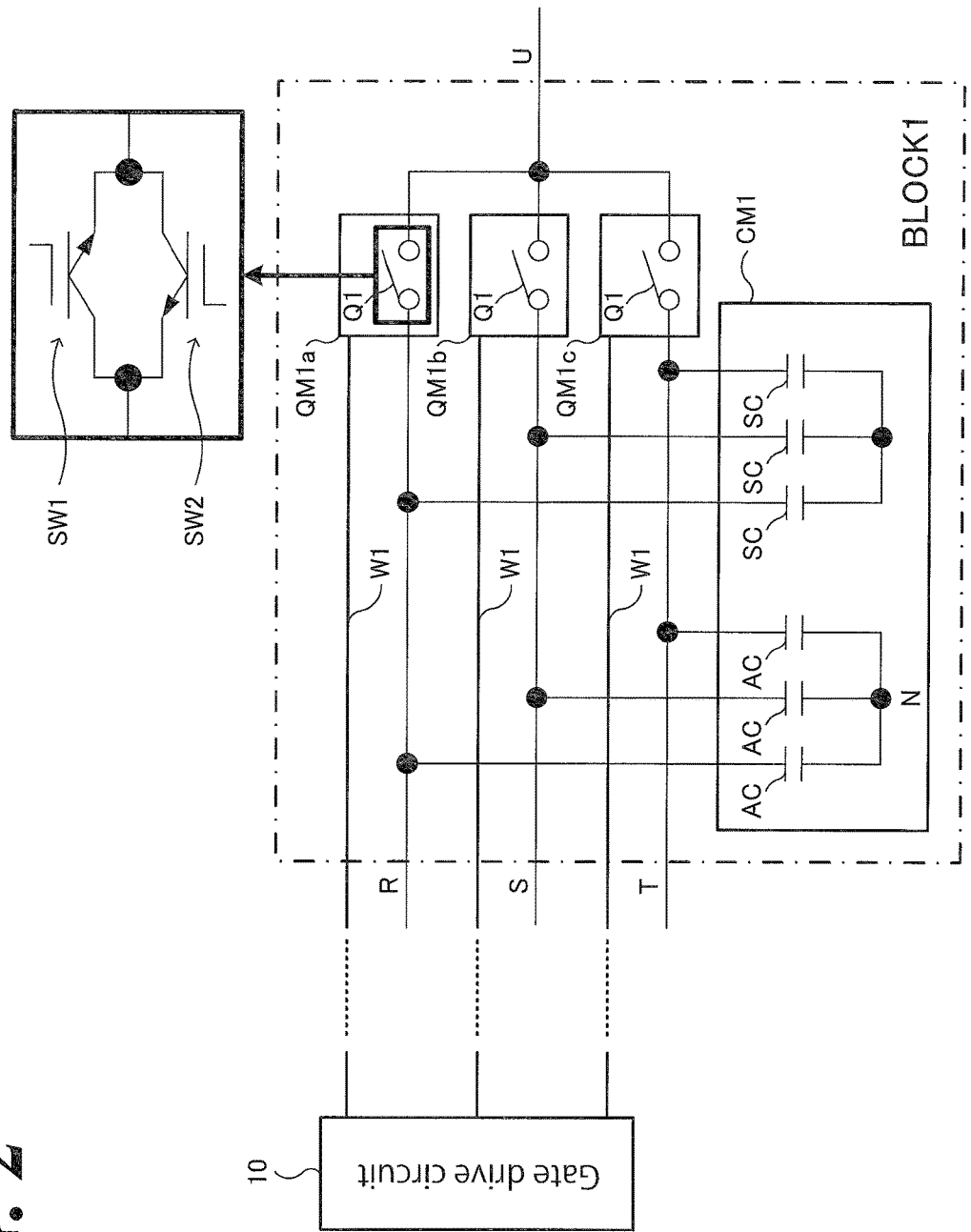
FIG. 2 is a circuit diagram illustrating a circuit configuration at a position on the circuit corresponding to "BLOCK 1" illustrated in FIG. 1.
Figure 3:
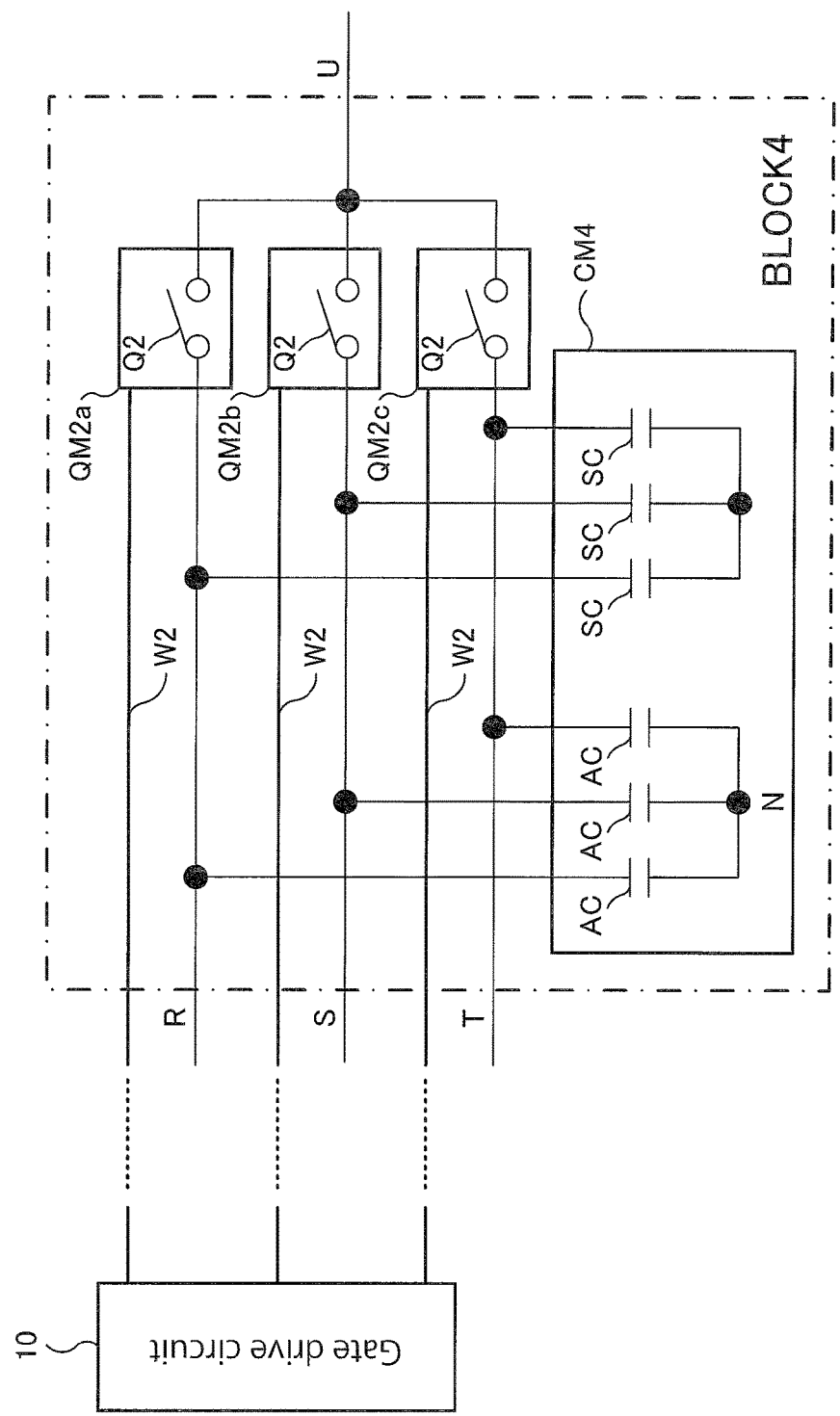
FIG. 3 is a circuit diagram illustrating a circuit configuration at a position on the circuit corresponding to "BLOCK 4" illustrated in FIG. 1.

As illustrated in FIGS. 1 to 3, a matrix convertor 1 is a power convertor to directly convert AC power input from an AC power source 2 into AC power of a desired voltage and frequency, and to output the converted AC power to a load 4 (AC motor in this example).

There is no particular limitation to the number of input phases of the AC power source 2 in the matrix convertor 1. In this embodiment, the number of the input phases is three (R phase, S phase, and T phase). That is, the AC power source 2 is a three-phase AC power source. Similarly, there is no particular limitation to the number of output phases of the load 4 in the matrix convertor 1. In this embodiment, the number of the output phases is three (U phase, V phase, and W phase). That is, the load 4 is a three-phase AC load (three-phase AC motor in this example). The load 4 will not particularly be limited to an AC motor insofar as the load 4 is an electronic device to operate on AC power input from the matrix convertor 1.

The matrix convertor 1 includes three AC reactors L1, L2, and L3, a plurality of first bidirectional switches Q1, a plurality of second bidirectional switches Q2, a plurality of AC capacitor units AC, a plurality of snubber capacitors SC, and a gate drive circuit 10.

In this embodiment, the number of the first bidirectional switches Q1 is nine. The number of the second bidirectional switches Q2 is the same as the number of the first bidirectional switches Q1. That is, a group of nine second bidirectional switches Q2 is provided. In a context in the following description where it is not necessary to discriminate the first bidirectional switches Q1 from the second bidirectional switches Q2, the first bidirectional switches Q1 and the second bidirectional switches Q2 will be collectively referred to as "bidirectional switches Q". The number of the AC capacitor units AC and the number of the snubber capacitors SC are the same as the number of the bidirectional switches Q. That is, 18 AC capacitor units AC and 18 snubber capacitors SC are provided. In FIG. 1, to avoid complication of the illustration, the bidirectional switches Q, the AC capacitor units AC, and the snubber capacitors SC are omitted. Instead, their positions on the circuit are conceptually illustrated using "BLOCK".

The AC reactors L1, L2, and L3 are respectively coupled to the R phase, the S phase, and the T phase of the AC power source 2. In a context in the following description where it is not necessary to discriminate the AC reactors L1, L2, and L3 from each other, the AC reactors L1, L2, and L3 will be collectively referred to as "AC reactors L". On the output side of each of the AC reactors L1 to L3, a power supply line diverges into six power supply lines. Each of the power supply lines diverged on the output side of the AC reactors L will be referred to as "diverged power supply line" as necessary.

The nine first bidirectional switches Q1 each include two switches SW1 and SW2 (IGBTs in this example). The switches SW1 and SW2 are coupled to each other electrically in parallel and in reverse directions (see the partial enlarged view in FIG. 2). The switches SW1 and SW2 will not be limited to IGBTs; any other configuration is possible insofar as MOSFETs, GTOs, or other devices switching-controllable (ON/OFF controllable) at the gate drive circuit 10 are contained. The configuration of the first bidirectional switch Q1 will not particularly be limited to the configuration including the two switches SW1 and SW2. The nine first bidirectional switches Q1 each are coupled to one of the R phase, the S phase, and the T phase on the output side of one of the AC reactors L1 to L3, and are coupled to one of the U phase, the V phase, and the W phase of the load 4. That is, the nine first bidirectional switches Q1 are divided into three groups each made up of three first bidirectional switches Q1. The three first bidirectional switches Q1 in each group are respectively coupled to the R phase, the S phase, and the T phase on the output side of the AC reactors L1 to L3, and coupled electrically in parallel to an identical one of the output phases of the load 4. In this case, the groups of the first bidirectional switches Q1 are coupled to different output phases of the load 4.

Specifically, the three groups of first bidirectional switches Q1 are respectively located at the positions on the circuit indicated as "BLOCK 1", "BLOCK 2", and "BLOCK 3". As illustrated in FIG. 2, which illustrates "BLOCK 1", the three first bidirectional switches Q1 are modularized into three modules, namely, first switch modules QM1a, QM1b, and QM1c, and respectively coupled to the R phase, the S phase, and the T phase of the AC power source 2. At the same time, the three first bidirectional switches Q1 are coupled electrically in parallel to the U phase of the load 4. In "BLOCK 2", which is not elaborated in the drawings, the three first bidirectional switches Q1 are modularized into three modules, namely, first switch modules QM1d, QM1e, and QM1f (see FIG. 4, described later), and respectively coupled to the R phase, the S phase, and the T phase of the AC power source 2. At the same time, the three first bidirectional switches Q1 are coupled electrically in parallel to the V phase of the load 4. In "BLOCK 3", which is not elaborated in the drawings, the three first bidirectional switches Q1 are modularized into three modules, namely, first switch modules QM1g, QM1h, and QM1i (see FIG. 4, described later), and respectively coupled to the R phase, the S phase, and the T phase of the AC power source 2. At the same time, the three first bidirectional switches Q1 are coupled electrically in parallel to the W phase of the load 4. In a context in the following description where it is not necessary to discriminate the first switch modules QM1a to QM1i from each other, the first switch modules QM1a to QM1i will be collectively referred to as "first switch modules QM1".

The nine second bidirectional switches Q2 each are coupled to one of the R phase, the S phase, and the T phase on the output side of one of the AC reactors L1 to L3, and are coupled to one of the U phase, the V phase, and the W phase of the load 4. Here, the nine second bidirectional switches Q2 coupled to any of the input phases are electrically parallel to the first bidirectional switches Q1 coupled to the identical input phase. The nine second bidirectional switches Q2 coupled to any of the output phases are electrically parallel to the first bidirectional switches Q1 electrically in parallel to the first bidirectional switches Q1 coupled to the identical output phase. That is, the nine second bidirectional switches Q2 are divided into three groups each made up of three second bidirectional switches Q2. The three second bidirectional switches Q2 in each group are respectively coupled to the R phase, the S phase, and the T phase on the output side of the AC reactors L1 to L3, and coupled electrically in parallel to an identical one of the output phases of the load 4. In this case, the groups of the second bidirectional switches Q2 are coupled to different output phases of the load 4.

Specifically, the three groups of second bidirectional switches Q2 are respectively located at the positions on the circuit indicated as "BLOCK 4", "BLOCK 5", and "BLOCK 6". As illustrated in FIG. 3, which illustrates "BLOCK 4", the three second bidirectional switches Q2 are modularized into three modules, namely, second switch modules QM2a, QM2b, and QM2c, and respectively coupled to the R phase, the S phase, and the T phase of the AC power source 2. At the same time, the three second bidirectional switches Q2 are coupled electrically in parallel to the U phase of the load 4. In "BLOCK 5", which is not elaborated in the drawings, the three second bidirectional switches Q2 are modularized into three modules, namely, second switch modules QM2d, QM2e, and QM2f (see FIG. 4, described later), and respectively coupled to the R phase, the S phase, and the T phase of the AC power source 2. At the same time, the three second bidirectional switches Q2 are coupled electrically in parallel to the V phase of the load 4. In "BLOCK 6", which is not elaborated in the drawings, the three second bidirectional switches Q2 are modularized into three modules, namely, second switch modules QM2g, QM2h, and QM2i (see FIG. 4, described later), and respectively coupled to the R phase, the S phase, and the T phase of the AC power source 2. At the same time, the three second bidirectional switches Q2 are coupled electrically in parallel to the W phase of the load 4. In a context in the following description where it is not necessary to discriminate the second switch modules QM2a to QM2i from each other, the second switch modules QM2a to QM2i will be collectively referred to as "second switch modules QM2". Also, where it is not necessary to discriminate the first switch modules QM1 from the second switch modules QM2, the first switch modules QM1 and the second switch modules QM2 will be collectively referred to as "switch modules QM".

The 18 AC capacitor units AC each include a plurality of AC capacitors (not illustrated) coupled electrically in parallel to each other. The 18 AC capacitor units AC are divided into six groups each made up of three AC capacitor units. The three AC capacitor units AC in each group diverge on the output side of the AC reactors L1 to L3. Also, the three AC capacitor units AC in each group are coupled (in the form of, for example, star connection) to the R phase, the S phase, and the T phase on the three diverged power supply lines respectively coupled to the three bidirectional switches Q in one group.

The 18 snubber capacitors SC are divided into six groups each made up of three snubber capacitors. The three snubber capacitors SC in each group diverge on the output side of the AC reactors L1 to L3. Also, the three snubber capacitors SC in each group are coupled to the R phase, the S phase, and the T phase on the three diverged power supply lines respectively coupled to the three bidirectional switches Q in one group.

Thus, the six groups of the AC capacitor units AC and the six groups of the snubber capacitors SC are respectively located at the positions on the circuit that are indicated by "BLOCK 1" to "BLOCK 6".

Figure 5:
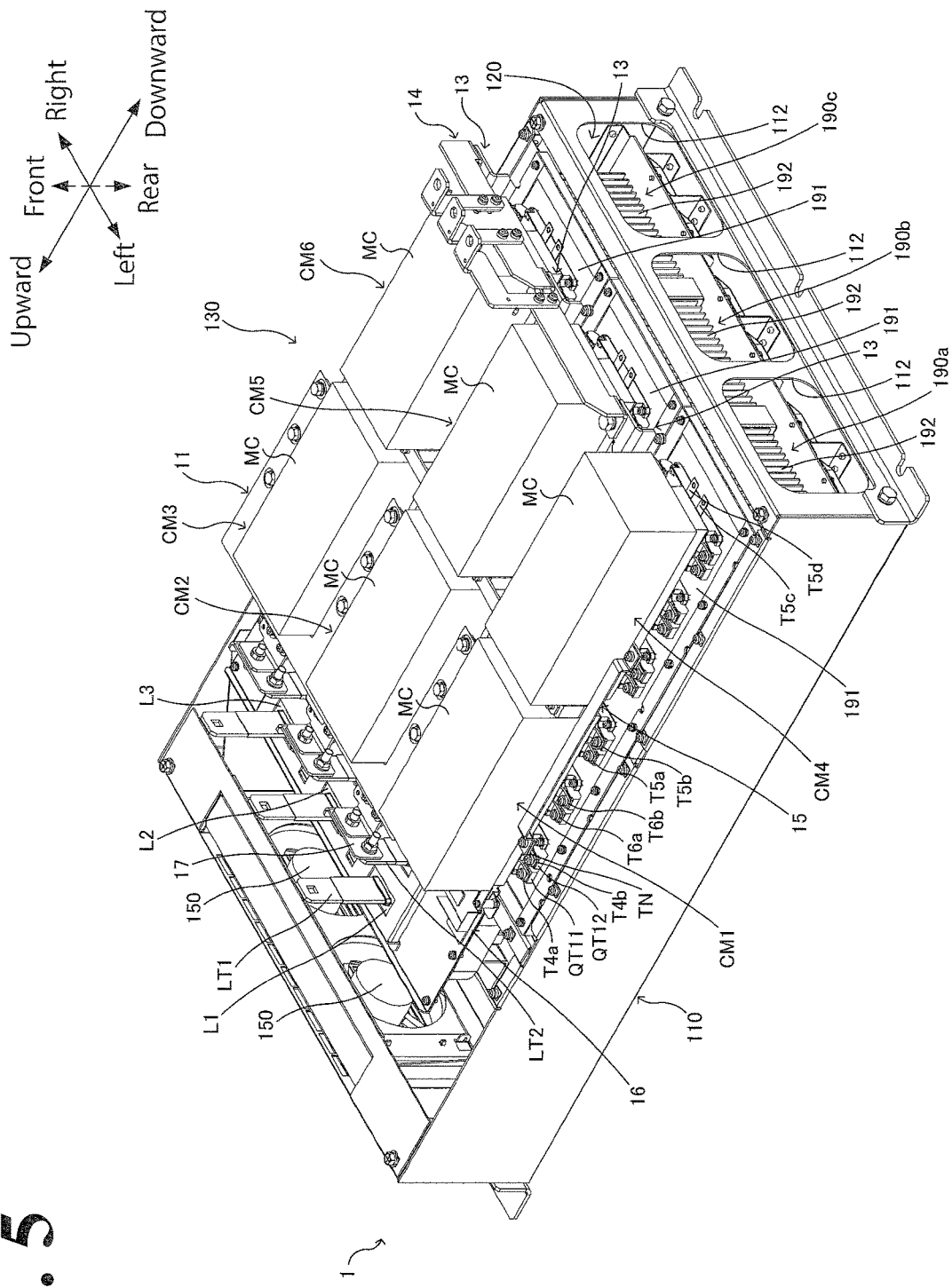
FIG. 5 is a perspective view of the matrix convertor, illustrating a specific configuration of the matrix convertor without a main body case.

In each of "BLOCK 1" to "BLOCK 3", the three first bidirectional switches Q1 located at the position on the circuit indicated by each "BLOCK" are respectively coupled to the three diverged power supply lines. On the three diverged power supply lines, the three AC capacitor units AC are coupled to the R phase, the S phase, and the T phase, and also, the three snubber capacitors are coupled to the R phase, the S phase, and the T phase (see FIG. 2). Here, as illustrated in FIG. 2, the three AC capacitor units AC and the three snubber capacitors SC in "BLOCK 1" are modularized into a capacitor module CM1 (also see FIG. 5, described later). The three AC capacitor units AC and the three snubber capacitors SC in "BLOCK 2", which are not elaborated in the drawings, are modularized into a capacitor module CM2 (see FIG. 5, described later). The three AC capacitor units AC and the three snubber capacitors SC in "BLOCK 2", which are not elaborated in the drawings, are modularized into a capacitor module CM3 (see FIG. 5, described later).

In each of "BLOCK 4" to "BLOCK 6", the three second bidirectional switches Q2 located at the position on the circuit indicated by each "BLOCK" are respectively coupled to the three diverged power supply lines. On the three diverged power supply lines, the three AC capacitor units AC are coupled to the R phase, the S phase, and the T phase, and also, the three snubber capacitors are coupled to the R phase, the S phase, and the T phase (see FIG. 3). Here, as illustrated in FIG. 3, the three AC capacitor units AC and the three snubber capacitors SC in "BLOCK 4" are modularized into a capacitor module CM4 (also see FIG. 5, described later). The three AC capacitor units AC and the three snubber capacitors SC in "BLOCK 5", which are not elaborated in the drawings, are modularized into a capacitor module CM5 (see FIG. 5, described later). The three AC capacitor units AC and the three snubber capacitors SC in "BLOCK 6", which are not elaborated in the drawings, are modularized into a capacitor module CM6 (see FIG. 5, described later). In a context in the following description where it is not necessary to discriminate the capacitor modules CM1 to CM6 from each other, the capacitor modules CM1 to CM6 will be collectively referred to as "capacitor modules CM".

The gate drive circuit 10 is coupled to the nine first bidirectional switches Q1 (namely, the first switch modules QM1a to QM1i) respectively through nine first signal wires W1 (see FIG. 2), and coupled to the nine second bidirectional switches Q2 (namely, the second switch modules QM2a to QM2i) respectively through nine second signal wires W2 (see FIG. 3). By switching control of the nine first bidirectional switches Q1 and the nine second bidirectional switches Q2, the gate drive circuit 10 controls each of the 18 bidirectional switches Q to perform a switching operation. Here, the signal wires W1 and W2 of the switch modules QM1 and QM2 have equal lengths. The switch modules QM1 and QM2 are electrically parallel to each other between the identical input phase and output phase to which the switch modules QM1 and QM2 are coupled.

Specifically, the signal wires W1 and W2 of the switch modules QM1a and QM2a, which are electrically parallel to each other between the R phase and the U phase, have equal lengths. The signal wires W1 and W2 of the switch modules QM1b and QM2b, which are electrically parallel to each other between the S phase and the U phase, have equal lengths. The signal wires W1 and W2 of the switch modules QM1c and QM2c, which are electrically parallel to each other between the T phase and the U phase, have equal lengths. The signal wires W1 and W2 of the switch modules QM1d and QM2d, which are electrically parallel to each other between the R phase and the V phase, have equal lengths, which is not elaborated in the drawings. The signal wires W1 and W2 of the switch modules QM1e and QM2e, which are electrically parallel to each other between the S phase and the V phase, have equal lengths. The signal wires W1 and W2 of the switch modules QM1f and QM2f, which are electrically parallel to each other between the T phase and the V phase, have equal lengths. The signal wires W1 and W2 of the switch modules QM1g and QM2g, which are electrically parallel to each other between the R phase and the W phase, have equal lengths, which is not elaborated in the drawings. The signal wires W1 and W2 of the switch modules QM1h and QM2h, which are electrically parallel to each other between the S phase and the W phase, have equal lengths. The signal wires W1 and W2 of the switch modules QM1i and QM2i, which are electrically parallel to each other between the T phase and the W phase, have equal lengths.

(Outline of Arrangement of Switch Modules)

Next, by referring to FIG. 4, an outline of an arrangement of the switch modules QM will be described.

Figure 4:
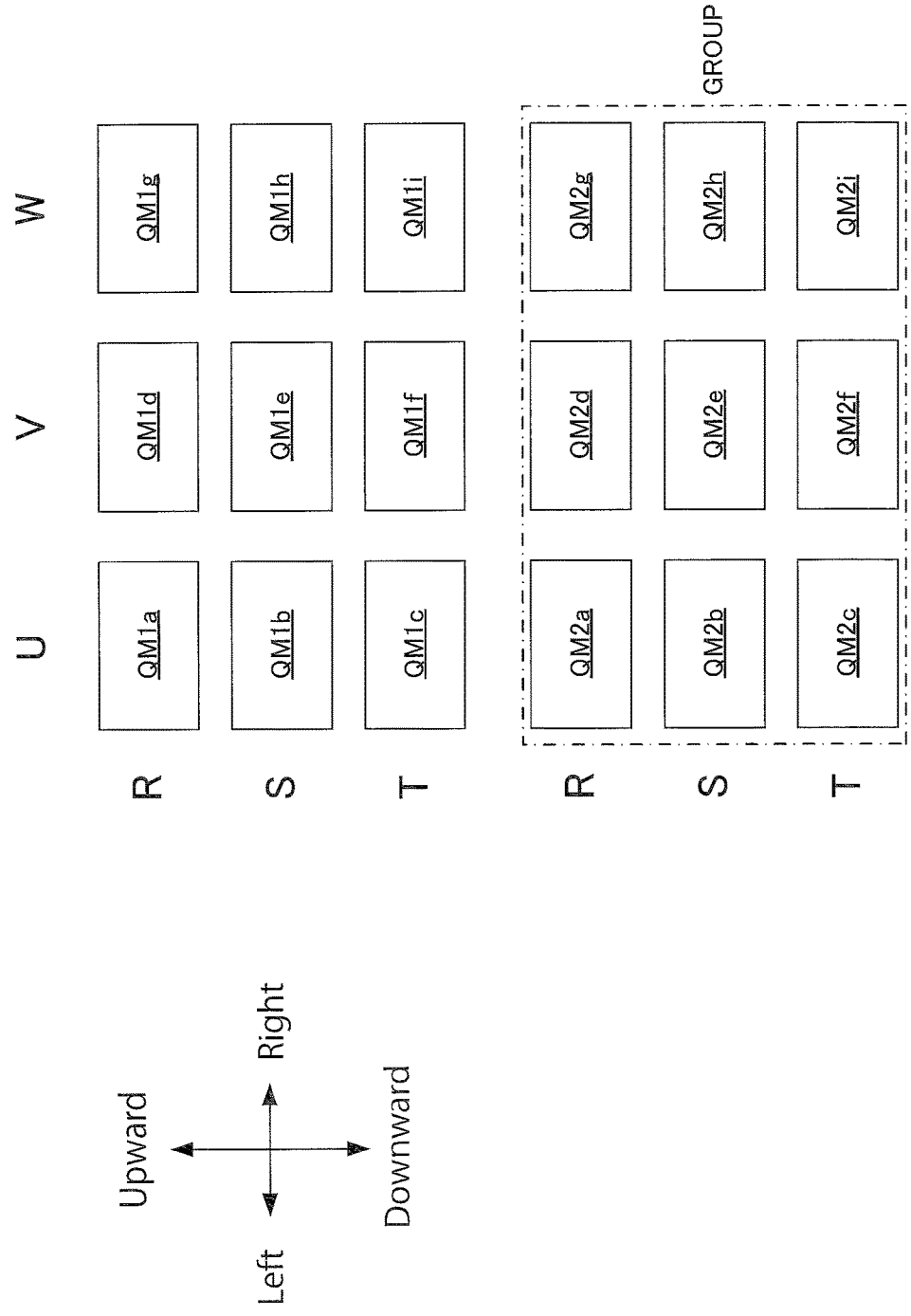
FIG. 4 is a conceptual diagram illustrating a concept of an arrangement of switch modules.

As illustrated in FIG. 4, in the matrix convertor 1, the first switch modules QM1a to QM1i are arranged to form one unit. Specifically, the first switch modules QM1a to QM1i are classified according to the U phase, the V phase, and the W phase, and the three first switch modules QM1 that correspond to each of the U phase, the V phase, and the W phase and that are respectively coupled to the R phase, the S phase, and the T phase are next to each other. More specifically, the three first switch modules QM1 that correspond to each of the U phase, the V phase, and the W phase and that are respectively coupled to the R phase, the S phase, and the T phase are aligned at short intervals in the upward/downward direction, which is the longitudinal direction of a casing 110 (see FIG. 5, described later) of the matrix convertor 1.

That is, the first switch modules QM1a, QM1b, and QM1c are respectively coupled to the R phase, the S phase, and the T phase while at the same time being electrically parallel to each other in their coupling to the U phase. Thus, the first switch modules QM1a, QM1b, and QM1c are aligned at short intervals in the upward/downward direction (also see, for example, FIG. 6, described later). The first switch modules QM1d, QM1e, and QM1f are respectively coupled to the R phase, the S phase, and the T phase while at the same time being electrically parallel to each other in their coupling to the V phase. Thus, the first switch modules QM1d, QM1e, and QM1 are aligned at short intervals in the upward/downward direction (also see, for example, FIG. 6, described later). The first switch modules QM1g, QM1h, and QM1i are respectively coupled to the R phase, the S phase, and the T phase while at the same time being electrically parallel to each other in their coupling to the W phase. Thus, the first switch modules QM1g, QM1h, and QM1i are aligned at short intervals in the upward/downward direction (also see, for example, FIG. 6, described later). Here, the column of the first switch modules QM1a, QM1b, and QM1c, which are coupled to the U phase, the column of the first switch modules QM1d, QM1e, and QM1f, which are coupled to the V phase, and the column of the first switch modules QM1g, QM1h, and QM1i, which are coupled to the W phase, are arranged in the right/left direction (also see, for example, FIG. 6, described later). Consequently, the nine first switch modules QM1a to QM1i form a three-by-three matrix in the upward/downward direction and the right/left direction.

The above-described arrangement of the plurality of first switch modules QM1 should not be construed in a limiting sense, but any other arrangement is also possible.

The second switch modules QM2a to QM2i may be arranged on a group basis. In this embodiment, the second switch modules QM2a to QM2i form one group. In other words, the second switch modules QM2a to QM2i are concentrated into one unit. Specifically, the second switch modules QM2a to QM2i are classified according to the U phase, the V phase, and the W phase, and the three second switch modules QM2 that correspond to each of the U phase, the V phase, and the W phase and that are respectively coupled to the R phase, the S phase, and the T phase are next to each other. More specifically, the three second switch modules QM2 that correspond to each of the U phase, the V phase, and the W phase and that are respectively coupled to the R phase, the S phase, and the T phase are aligned at short intervals in the upward/downward direction.

That is, the second switch modules QM2a, QM2b, and QM2c are respectively coupled to the R phase, the S phase, and the T phase while at the same time being electrically parallel to each other in their coupling to the U phase. Thus, the second switch modules QM2a, QM2b, and QM2c are aligned at short intervals in the upward/downward direction (also see, for example, FIG. 6, described later). The second switch modules QM2d, QM2e, and QM2f are respectively coupled to the R phase, the S phase, and the T phase while at the same time being electrically parallel to each other in their coupling to the V phase. Thus, the second switch modules QM2d, QM2e, and QM2 are aligned at short intervals in the upward/downward direction (also see, for example, FIG. 6, described later). The second switch modules QM2g, QM2h, and QM2i are respectively coupled to the R phase, the S phase, and the T phase while at the same time being electrically parallel to each other in their coupling to the W phase. Thus, the second switch modules QM2g, QM2h, and QM2i are aligned at short intervals in the upward/downward direction (also see, for example, FIG. 6, described later). Here, the column of the second switch modules QM2a, QM2b, and QM2c, which are coupled to the U phase, the column of the second switch modules QM2d, QM2e, and QM2f, which are coupled to the V phase, and the column of the second switch modules QM2g, QM2h, and QM2i, which are coupled to the W phase, are arranged in the right/left direction (also see, for example, FIG. 6, described later). Consequently, the nine second switch modules QM2a to QM2i form a three-by-three matrix in the upward/downward direction and the right/left direction.

The above-described arrangement of the plurality of second switch modules QM2 should not be construed in a limiting sense, but any other arrangement is also possible.

The three first switch modules QM1 and the three second switch modules QM2 coupled to the identical output phase are arranged to form one switch train in the upward/downward direction.

Figure 6:
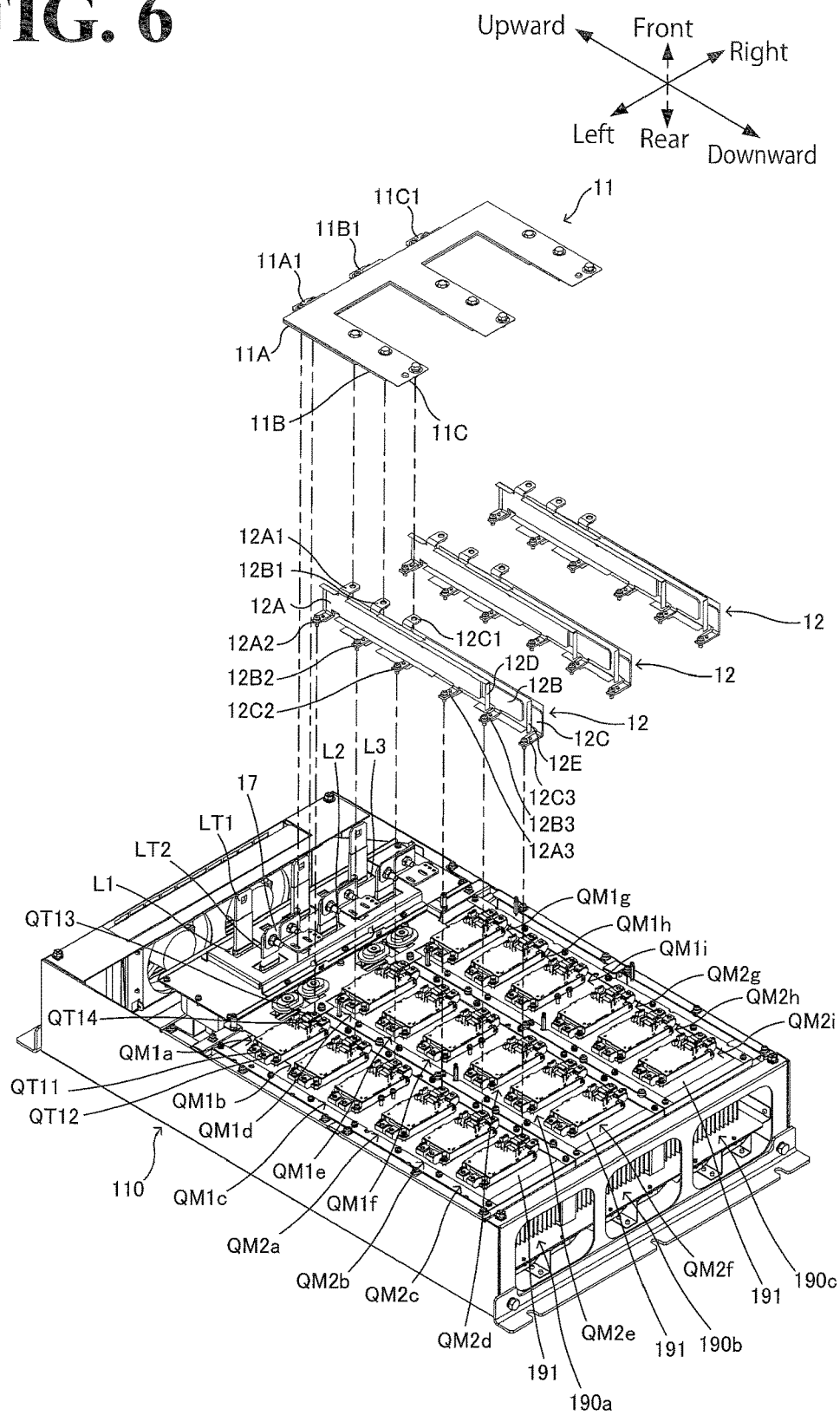
FIG. 6 is an exploded perspective view of the matrix convertor, illustrating a specific configuration of the matrix convertor illustrated in FIG. 5 without capacitor modules and some bus bars.

Specifically, the first switch modules QM1a, QM1b, and QM1c and the second switch modules QM2a, QM2b, and QM2c, which are coupled to the U phase, are arranged to form a U-phase output switch train aligned in the upward/downward direction (also see, for example, FIG. 6, described later). The first switch modules QM1d, QM1e, and QM1f and the second switch modules QM2d, QM2e, and QM2f, which are coupled to the V phase, are arranged to form a V-phase output switch train aligned in the upward/downward direction (also see, for example, FIG. 6, described later). The first switch modules QM1g, QM1h, and QM1i and the second switch modules QM2g, QM2h, and QM2i, which are coupled to the W phase, are arranged to form a W-phase output switch train aligned in the upward/downward direction (also see, for example, FIG. 6, described later).

(Specific Configuration of Matrix Convertor)

Figure 7:
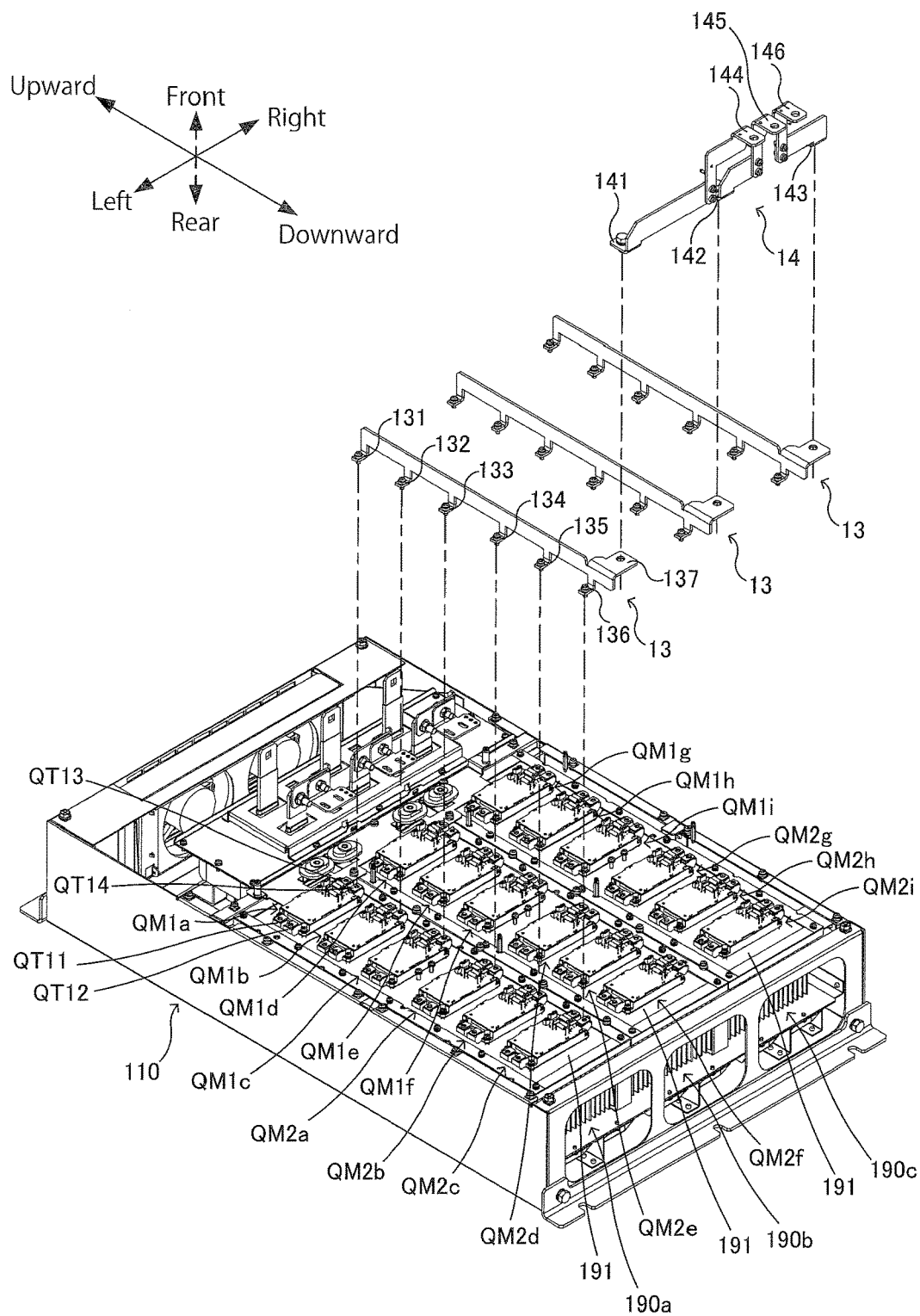
FIG. 7 is an exploded perspective view of the matrix convertor, illustrating a specific configuration of the matrix convertor illustrated in FIG. 5 without the capacitor modules and some bus bars.
Figure 8:
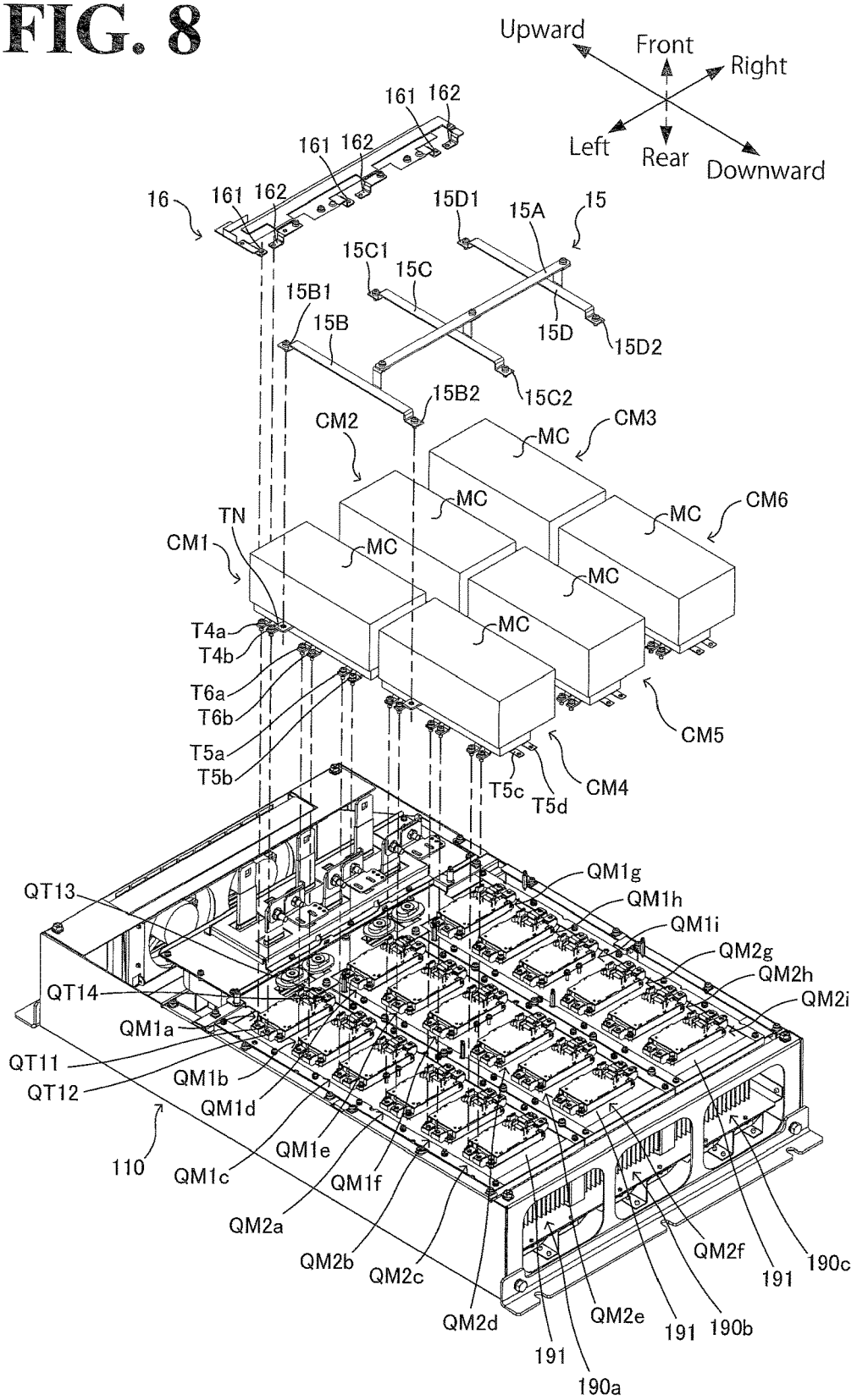
FIG. 8 is an exploded perspective view of the matrix convertor, illustrating a specific configuration of the matrix convertor illustrated in FIG. 5 without some bus bars.

Next, by referring to FIGS. 5 to 8, a specific configuration of the matrix convertor 1 will be described. In FIGS. 6 to 8, to avoid complication of the illustration, connection lines between the component parts of the matrix convertor 1 are partially omitted.

As illustrated in FIGS. 5 to 8, the matrix convertor 1 includes the casing 110, a coolant duct 120, a main body 130, and a main body case (not illustrated). The main body case houses the main body 130. The main body 130 includes the AC reactors L1 to L3, the first switch modules QM1a to QM1i, the second switch modules QM2a to QM2i, the capacitor modules CM1 to CM6, and a substrate (not illustrated) on which the gate drive circuit 10 is mounted. In FIGS. 5 to 8, for convenience of description, the matrix convertor 1 is illustrated in such a manner that the longitudinal direction of the casing 110, the widthwise direction perpendicular of the casing 110 to the longitudinal direction, and the depth direction of the casing 110 perpendicular to the longitudinal direction and the widthwise direction respectively correspond to the upward/downward direction, the right/left direction, and the front/rear direction. In this case, the upward/downward direction corresponds to a first direction.

Three heat sinks 190a, 190b, and 190c are attached to a base (not illustrated) of the casing 110 side by side in the right/left direction. The number of heat sinks attached to the base of the casing 110 will not particularly be limited to three. For example, one or two wider heat sinks may be attached to the base of the casing 110 or four or more narrower heat sinks may be attached to the base of the casing 110. The heat sinks 190a to 190c are made of a heat conductive material such as aluminum and copper. Each of the heat sinks 190a to 190c includes a base 191 and a plurality of fins 192. The base 191 has a plate shape. The plurality of fins 192 stand on the base 191. The heat sink is attached to the base of the casing 110 in such a manner that the fins 192 are accommodated in the coolant duct 120.

On the front surface of the base 191 of the left heat sink 190a, the first switch modules QM1a, QM1b, and QM1c are aligned at short intervals in the upward/downward direction, and the second switch modules QM2a, QM2b, and QM2c are aligned at short intervals in the upward/downward direction. Thus, the U phase output switch train is disposed on the front surface of the base 191 of the left heat sink 190a.

On the front surface of the base 191 of the center heat sink 190b, the first switch modules QM1d, QM1e, and QM1f are aligned at short intervals in the upward/downward direction, and the second switch modules QM2d, QM2e, and QM2f are aligned at short intervals in the upward/downward direction. Thus, the V phase output switch train is disposed on the front surface of the base 191 of the center heat sink 190b.

On the front surface of the base 191 of the right heat sink 190c, the first switch modules QM1g, QM1h, and QM1i are aligned at short intervals in the upward/downward direction, and the second switch modules QM2g, QM2h, and QM2i are aligned at short intervals in the upward/downward direction. Thus, the W phase output switch train is disposed on the front surface of the base 191 of the right heat sink 190c.

The coolant duct 120 is a space for coolant (such as air) formed inside of the casing 110 to flow. The coolant flows in a direction in parallel to the direction along the U phase output switch train, the V phase output switch train, and the W phase output switch train, that is, in the upward/downward direction. Specifically, (three in this example) openings 112 are formed in the lower wall of the casing 110, and (two in this example) fans 150 are disposed on the upper end of the casing 110. The fans 150 draw the coolant through the openings 112 and discharge the coolant from the upper end of the casing 110. Consequently, the coolant flows in the coolant duct 120 in the upward/downward direction (specifically, from the bottom to the top). The fans 150 may draw the coolant from the upper end of the casing 110 and discharge the coolant through the openings 112 in such a manner that the coolant flows in the coolant duct 120 in the upward/downward direction (specifically, from the top to the bottom). The direction of the coolant flow in the coolant duct 120 will not particularly be limited to the upward/downward direction; another direction (right/left direction, for example) is also possible.

The AC reactors L1 to L3 are disposed above the heat sinks 190a to 190c of the coolant duct 120 (on the downstream side of the coolant flow direction) in the right/left direction. The AC reactors L1, L2, and L3 are respectively coupled to the R phase, the S phase, and the T phase of the AC power source 2 through bus bars (not illustrated). Specifically, each of the AC reactors L1 to L3 includes two terminals LT1 and LT2. The terminals LT1 and LT2 protrude from the coolant duct 120 to the front (the portion housed in the main body case). The terminals LT1 of the AC reactors L1, L2, and L3 are respectively fastened with screws and coupled to a terminal of the bus bar coupled to the R phase of the AC power source 2, a terminal of the bus bar coupled to the S phase, and a terminal of the bus bar coupled to the T phase. The AC reactors L1 to L3 may be coupled to the respective output phases of the AC power source 2 through cables.

The first switch modules QM1a to QM1i and the second switch modules QM2a to QM2i each include two terminals QT11 and QT12 on the left end and two terminals QT13 and QT14 on the right end.

The capacitor modules CM1 to CM6 each include a module cover MC, which is made of resin. The module cover MC is not necessarily made of resin but may be made of any other material. The module cover MC of each of the capacitor modules CM1 to CM6 houses the three AC capacitor units AC and the three snubber capacitors SC corresponding to the three relevant switch modules QM. In this example, the three AC capacitor units AC and the three snubber capacitors SC corresponding to the three switch modules QM are housed in the module cover MC and modularized as the capacitor module CM. This, however, should not be construed in a limiting sense. For example, while the three AC capacitor units AC are housed in the module cover and modularized as the capacitor module, the three snubber capacitors SC may be a separate unit from the capacitor module.

Specifically, in the module cover MC of the capacitor module CM1, the three AC capacitor units AC and the three snubber capacitors SC corresponding to the first switch modules QM1a, QM1b, and QM1c are housed. In the module cover MC of the capacitor module CM2, the three AC capacitor units AC and the three snubber capacitors SC corresponding to the first switch modules QM1d, QM1e, and QM1f are housed. In the module cover MC of the capacitor module CM3, the three AC capacitor units AC and the three snubber capacitors SC corresponding to the first switch modules QM1g, QM1h, and QM1i are housed. In the module cover MC of the capacitor module CM4, the three AC capacitor units AC and the three snubber capacitors SC corresponding to the second switch modules QM2a, QM2b, and QM2c are housed. In the module cover MC of the capacitor module CM5, the three AC capacitor units AC and the three snubber capacitors SC corresponding to the second switch modules QM2d, QM2e, and QM2f are housed. In the module cover MC of the capacitor module CM6, the three AC capacitor units AC and the three snubber capacitors SC corresponding to the second switch modules QM2g, QM2h, and QM2i are housed.

The module cover MC of each of the capacitor modules CM1 to CM6 has a length corresponding to the three relevant switch modules QM (approximately the same length as a row of the three switch modules QM). The module cover MC of each of the capacitor modules CM1 to CM6 may have a length larger or smaller than the length corresponding to the three relevant switch modules QM.

(Configuration of Capacitor Module)

By referring to FIGS. 9A to 10, a configuration of the capacitor modules CM1 to CM6 will be described below.

Figure 9A:
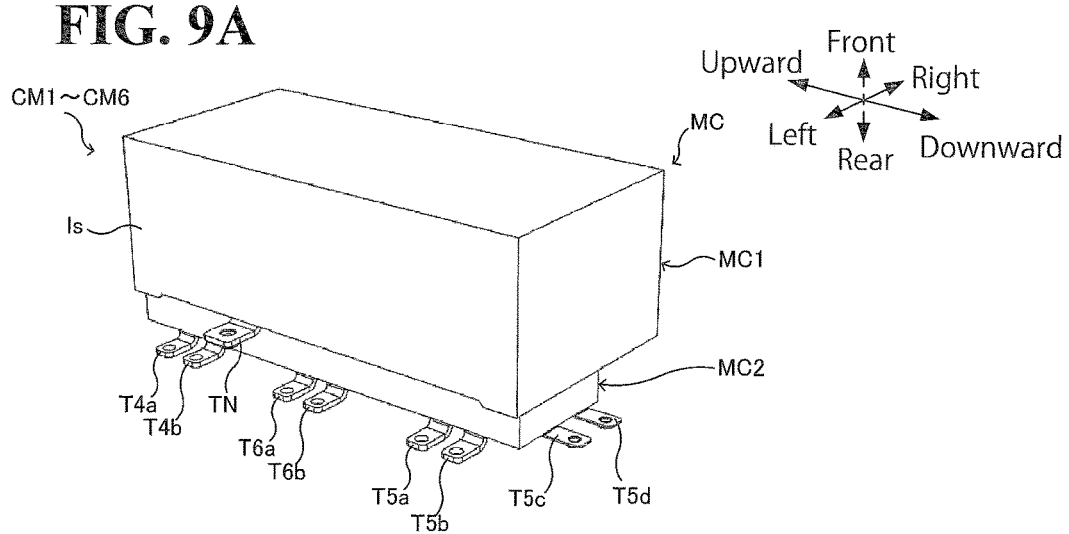
FIG. 9A is a perspective view of the capacitor module, illustrating a configuration of the capacitor module.
Figure 9B:
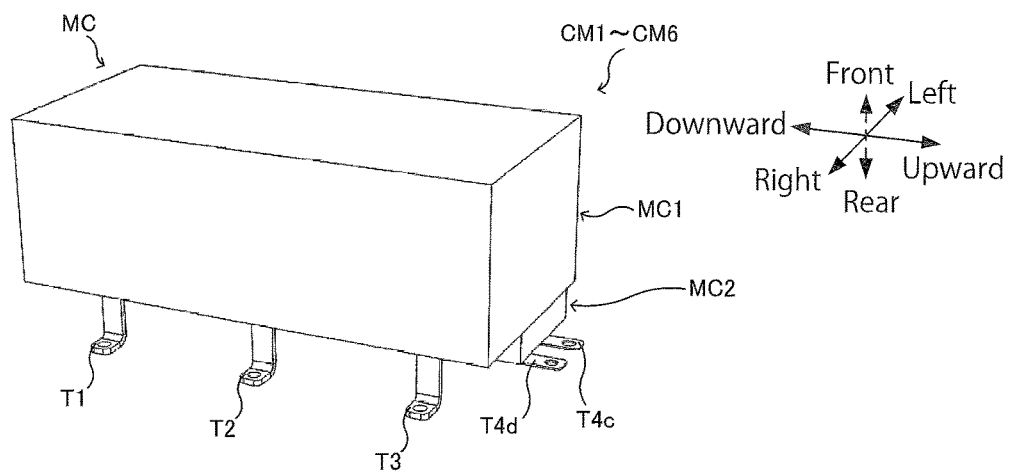
FIG. 9B is a perspective view of the capacitor module, illustrating the configuration of the capacitor module.
Figure 9C:
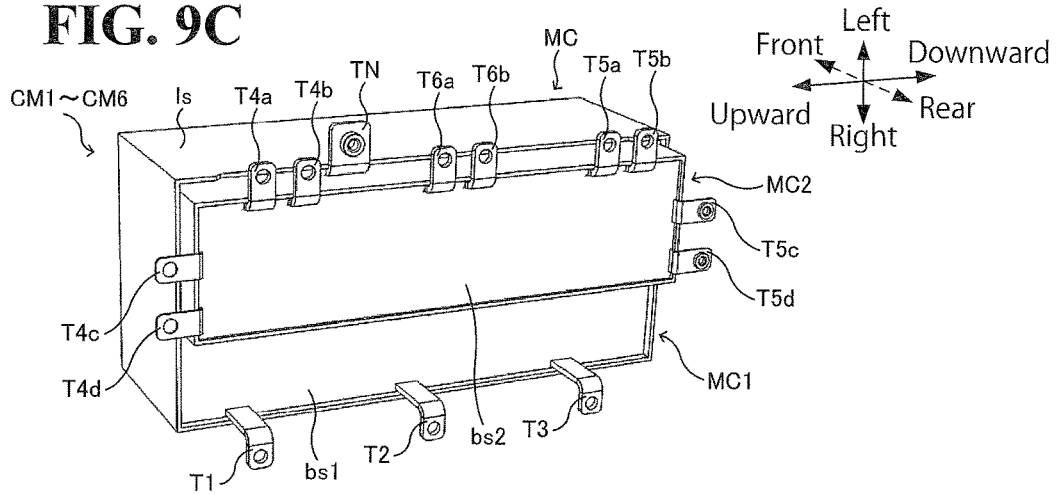
FIG. 9C is a perspective view of the capacitor module, illustrating the configuration of the capacitor module.

As illustrated in FIGS. 9A to 10, the module cover MC of each of the capacitor modules CM1 to CM6 includes a first container MC1 and a second container MC2. The first container MC1 has an approximately rectangular parallelepiped shape and contains the three AC capacitor units AC. The second container MC2 has an approximately rectangular parallelepiped shape and contains the three snubber capacitors SC. The three AC capacitor units AC and the three snubber capacitors SC may be contained in a common container.

The first container MC1 includes input-output terminals T1, T2, and T3 and a neutral terminal TN. The input-output terminals T1, T2, and T3 are respectively input-output terminals of the three AC capacitor units AC contained in the first container MC1. The neutral terminal TN is coupled to a neutral N (see FIGS. 2 and 3) of connection of the three AC capacitor units AC.

On one side (right side in this example) of the module cover MC in the widthwise direction, the input-output terminals T1, T2, and T3 protrude from a bottom surface bs1 of the first container MC1. Each of the input-output terminals T1, T2, and T3 is bent in such a manner that the distal end has a parallel surface to the bottom surface bs1. The neutral terminal TN is disposed on a side surface (left side surface is in this example) of the first container MC1. The neutral terminal TN is formed in such a manner that the distal end has a parallel surface to the bottom surface bs1.

The second container MC2 is disposed on the other side (left side in this example) of the module cover MC in the widthwise direction and on the rear side of the first container MC1. Thus, in the module cover MC, the three snubber capacitors SC are housed at a position closer to a bottom surface bs2 (rear side in this example) of the second container MC2 than the three AC capacitor units AC are to the bottom surface bs2. The second container MC2 includes input-output terminals of the respective three snubber capacitors SC contained in the second container MC2.

Specifically, the second container MC2 includes input-output terminals T4a, T4b, T4c, and T4d, input-output terminals T5a, T5b, T5c, and T5d, and input-output terminals T6a and T6b. The input-output terminals T4a, T4b, T4c, and T4d are input-output terminals of the snubber capacitor SC on one side (upper side in this example) of the module cover MC in the longitudinal direction perpendicular to the widthwise direction. The input-output terminals T5a, T5b, T5c, and T5d are input-output terminals of the snubber capacitor SC on the other side (lower side in this example) in the longitudinal direction of the module cover MC. The input-output terminals T6a and T6b are input-output terminals of the center snubber capacitor SC.

On the left side of the module cover MC, the input-output terminals T4a, T4b, T5a, T5b, T6a, and T6b protrude from the bottom surface bs2. The input-output terminals T4c and T4d protrude from the bottom surface bs2 on the upper side of the module cover MC. The input-output terminals T5c and T5d protrude from the bottom surface bs2 on the lower side of the module cover MC. Each of the input-output terminals T4a, T4b, T4c, T4d, T5a, T5b, T5c, T5d, T6a, and T6b is bent in such a manner that the distal end has a parallel surface to the bottom surface bs2.

Here, the distal ends of the input-output terminals T1, T2, T3, T4a, T4b, T5a, T5b, T6a, and T6b in the depth direction (front/rear direction in this example) perpendicular to the widthwise direction and the longitudinal direction of the module cover MC are on the rear side of the distal ends of the other input-output terminals T4c, T4d, T5c, and T5d in the front/rear direction. The distal ends of the input-output terminals T1, T2, T3, T4a, T4b, T5a, T5b, T6a, and T6b are flush with each other in the front/rear direction. It is noted, however, the positions of the distal ends of the input-output terminals T1, T2, T3, T4a, T4b, T5a, T5b, T6a, and T6b may not necessarily be flush with each other in the front/rear direction.

Each of the capacitor modules CM1 to CM6 of the above-described configuration stands on its own on the corresponding three switch modules QM (that is, with the bottom surfaces bs1 and bs2 off the ground) by the input-output terminals T1, T2, T3, T4a, T4b, T5a, T5b, T6a, and T6b disposed on the left and right sides of the capacitor module (see FIG. 10). That is, the input-output terminals T1, T2, T3, T4a, T4b, T5a, T5b, T6a, and T6b disposed on the left and right sides of the module cover MC correspond to the plurality of terminals.

The distal ends of the input-output terminals T4c, T4d, T5c, and T5d in the front/rear direction may be flush with the distal ends of the input-output terminals T1, T2, T3, T4a, T4b, T5a, T5b, T6a, and T6b. In this case, each of the capacitor modules CM1 to CM6 stands on its own on the corresponding three switch modules QM by the input-output terminals T1, T2, T3, T4a, T4b, T5a, T5b, T6a, and T6b and the input-output terminals T4c, T4d, T5c, and T5d. In this case, the input-output terminals T1, T2, T3, T4a, T4b, T5a, T5b, T6a, and T6b, which are disposed on the left and right sides of the module cover MC, and the input-output terminals T4d, T4d, T5c, and T5d, which are disposed on the upper and lower sides of the module cover MC, constitute a plurality of terminals. Each of the capacitor modules CM1 to CM6 may not necessarily stand on its own on the corresponding three switch modules QM by the plurality of terminals protruding from the bottom surface of the module cover MC. The capacitor modules CM1 to CM6 may be supported by securing members (of sheet metal, for example).

(Configurations of Bus Bars)

As illustrated in FIGS. 5 to 8, the AC reactors L1, L2, and L3 are coupled to the corresponding switch modules QM through a laminate bus bar 11 and three laminate bus bars 12. The laminate bus bar 11 and the laminate bus bars 12 correspond to second bus bars. The AC reactors L1, L2, and L3 may be coupled to the corresponding switch modules QM through bus bars and cables of any other configuration.

The laminate bus bar 11 includes a first bus bar 11A, a first insulation sheet (not illustrated), a second bus bar 11B, a second insulation sheet (not illustrated), and a third bus bar 11C, which are laminated in this order from one side (rear side in this example) to the other side (front side in this example) in the thickness direction. The first bus bar 11A, the second bus bar 11B, and the third bus bar 11C are of flat plates. It is noted that the first bus bar 11A, the second bus bar 11B, and the third bus bar 11C correspond to conductors. The first insulation sheet suppresses short-circuiting between the first bus bar 11A and the second bus bar 11B. The second insulation sheet suppresses short-circuiting between the second bus bar 11B and the third bus bar 11C.

The first bus bar 11A includes a terminal 11A1 and three terminals (not illustrated, hereinafter referred to as "first terminals" as necessary). The terminal 11A1 is disposed at the left end of a first flat plate extending in the right/left direction. The three terminals are disposed on distal ends of three second flat plates extending downwardly from the left end, center, and right end of the first flat plate. The second bus bar 11B includes a terminal 11B1 and three terminals (not illustrated, hereinafter referred to as "second terminals" as necessary). The terminal 11B1 is disposed at the left end of a first flat plate extending in the right/left direction. The three terminals are disposed on distal ends of three second flat plates extending downwardly from the left end, center, and right end of the first flat plate. The third bus bar 11C includes a terminal 11C1 and three terminals (not illustrated, hereinafter referred to as "third terminals" as necessary). The terminal 11C1 is disposed at the left end of a first flat plate extending in the right/left direction. The three terminals are disposed on distal ends of three second flat plates extending downwardly from the left end, center, and right end of the first flat plate.

The terminals 11A1, 11B1, and 11C1 are disposed at approximately the same positions on the laminate bus bar 11 in the upward/downward direction, and aligned in this order from the left to the right. The first terminal, the second terminal, and the third terminal of the bus bars 11A, 11B, and 11C on the left end side are disposed at approximately the same positions on the laminate bus bar 11 in the right/left direction, and aligned in this order from the upper side to the lower side. The same applies to the first terminals, the second terminals, and the third terminals of the bus bars 11A, 11B, and 11C on the center and the right end side.

Each of the laminate bus bars 12 includes a first bus bar 12A, a first insulation sheet 12D, a second bus bar 12B, a second insulation sheet 12E, and a third bus bar 12C, which are laminated in this order from one side (left side in this example) to the other side (right side in this example) in the thickness direction. The first bus bar 12A, the second bus bar 12B, and the third bus bar 12C are of flat plates. It is noted that the first bus bar 12A, the second bus bar 12B, and the third bus bar 12C correspond to conductors. The first insulation sheet 12D suppresses short-circuiting between the first bus bar 12A and the second bus bar 12B. The second insulation sheet 12E suppresses short-circuiting between the second bus bar 12B and the third bus bar 12C.

The first bus bar 12A includes a terminal 12A1 and a terminal 12A2 on the upper end, and a terminal 12A3 on the lower end. The terminal 12A1 is protruded forward. The terminal 12A2 is protruded rearward. The terminal 12A3 is protruded rearward. Each of the terminals 12A1, 12A2, and 12A3 is bent in such a manner that the distal end has a parallel surface to the thickness direction of the laminate bus bar 12. The second bus bar 12B includes a terminal 12B1 and a terminal 12B2 on the upper end, and a terminal 12B3 on the lower end. The terminal 12B1 is protruded forward. The terminal 12B2 is protruded rearward. The terminal 12B3 is protruded rearward. Each of the terminals 12B1, 12B2, and 12B3 is bent in such a manner that the distal end has a parallel surface to the thickness direction of the laminate bus bar 12. The third bus bar 12C includes a terminal 12C1 and a terminal 12C2 on the upper end, and a terminal 12C3 on the lower end. The terminal 12C1 is protruded forward. The terminal 12C2 is protruded rearward. The terminal 12C3 is protruded rearward. Each of the terminals 12C1, 12C2, and 12C3 is bent in such a manner that the distal end has a parallel surface to the thickness direction of the laminate bus bar 12.

The terminals 12A1, 12B1, and 12C1 are disposed at approximately the same positions on the laminate bus bar 12 in the right/left direction, and aligned in this order from the upper side to the lower side. The terminals 12A2, 12B2, 12C2, 12A3, 12B3, and 12C3 are disposed at approximately the same positions on the laminate bus bar 12 in the right/left direction, and aligned in this order from the upper side to the lower side.

The U phase, the V phase, and the W phase of the load 4 are coupled to the corresponding switch modules QM through three bus bars 13 and a bus bar 14. The U phase, the V phase, and the W phase of the load 4 may be coupled to the corresponding switch modules QM through bus bars and cables of any other configuration.

Each of the bus bars 13 includes six terminals 131, 132, 133, 134, 135, and 136, and a terminal 137. The terminals 131, 132, 133, 134, 135, and 136 are protruded rearward at positions from one end (upper end in this example) to the other end (lower end in this example) in the longitudinal direction. The terminal 137 is disposed on the lower end of the bus bar 13 and is protruded forward. Each of the terminals 131 to 137 is bent in such a manner that the distal end has a parallel surface to the thickness direction (right/left direction in this example) of the bus bar 13.

(Connection Relationship of Components of Matrix Convertor)

The terminals 12A2, 12B2, 12C2, 12A3, 12B3, and 12C3 of the laminate bus bar 12 are respectively coupled to the terminals QT13 of the switch modules QM1a, QM1b, QM1c, QM2a, QM2b, and QM2c. The input-output terminals T1, T2, and T3 (see FIG. 9B, for example) of the capacitor module CM1 are also respectively coupled to the terminals QT13 of the first switch modules QM1a, QM1b, and QM1c, and fastened with screws along with the terminals 12A2, 12B2, and 12C2 of the laminate bus bar 12. The input-output terminals T1, T2, and T3 (see FIG. 9B, for example) of the capacitor module CM4 are also respectively coupled to the terminals QT13 of the second switch modules QM2a, QM2b, and QM2c, and fastened with screws along with the terminals 12A3, 12B3, and 12C3 of the laminate bus bar 12. Similarly, the laminate bus bar 12 and the capacitor modules CM2 and CM5 are coupled to the terminals QT13 of the switch modules QM1d, QM1e, QM1f, QM2d, QM2e, and QM2f. Also, the laminate bus bar 12 and the capacitor modules CM3 and CM6 are coupled to the terminals QT13 of the switch modules QM1g, QM1h, QM1i, QM2g, QM2h, and QM2i.

The first terminal, the second terminal, and the third terminal on the left end of the laminate bus bar 11 are fastened with screws and coupled to the terminals 12A1, 12B1, and 12C1 of the laminate bus bar 12 coupled to the switch modules QM1a, QM1b, QM1c, QM2a, QM2b, and QM2c. The first terminal, the second terminal, and the third terminal on the center of the laminate bus bar 11 are fastened with screws and coupled to the terminals 12A1, 12B1, and 12C1 of the laminate bus bar 12 coupled to the switch modules QM1d, QM1e, QM1f, QM2d, QM2e, and QM2f. The first terminal, the second terminal, and the third terminal on the right end of the laminate bus bar 11 are fastened with screws and coupled to the terminals 12A1, 12B1, and 12C1 of the laminate bus bar 12 coupled to the switch modules QM1g, QM1h, QM1i, QM2g, QM2h, and QM2i.

The terminals 11A1, 11B1, and 11C1 of the laminate bus bars 11 are respectively coupled to the terminals LT2 of the AC reactors L1, L2, and L3 through a bus bar 17.

The terminals QT11 and QT12 of the first switch modules QM1a, QM1b, and QM1c are respectively fastened with screws and coupled to the input-output terminals T4a and T4b, the input-output terminals T6a and T6b, and the input-output terminals T5a and T5b of the capacitor module CM1. Similarly, the terminals QT11 and QT12 of the first switch modules QM1d, QM1e, and QM1f are coupled to the capacitor module CM2. Also, the terminals QT11 and QT12 of the first switch modules QM1g, QM1h, and QM1i are coupled to the capacitor module CM3. The terminals QT11 and QT12 of the second switch modules QM2a, QM2b, and QM2c are respectively fastened with screws and coupled to the input-output terminals T4a and T4b, the input-output terminals T6a and T6b, and the input-output terminals T5a and T5b of the capacitor module CM4. Similarly, the terminals QT11 and QT12 of the second switch modules QM2d, QM2e, and QM2f are coupled to the capacitor module CM5. Also, the terminals QT11 and QT12 of the second switch modules QM2g, QM2h, and QM2i are coupled to the capacitor module CM6.

That is, in each of the capacitor modules CM1 to CM6, the input-output terminals T1, T2, and T3 are coupled to the terminals QT13 of the three switch modules QM. Also, the input-output terminals T4a, T4b, T6a, T6b, T5a, and T5b are coupled to the terminals QT11 and QT12 of the three switch modules QM. Thus, each of the capacitor modules CM1 to CM6 is disposed in a freestanding manner on the three switch modules QM.

The terminals T5c and T5d of the capacitor modules CM1 to CM3 are respectively fastened with screws and coupled to the terminals T4c and T4d (see FIG. 9B, for example) of the capacitor modules CM4 to CM6. In this case, the neutral terminals TN of the capacitor modules CM1 to CM6 are coupled to each other through a bus bar 15 (corresponding to a first bus bar).

The bus bar 15 includes a linear portion 15A, a linear portion 15B, a linear portion 15C, and a linear portion 15D. The linear portion 15A extends in the right/left direction. The linear portion 15B is coupled to a left end portion of the linear portion 15A and extends in the upward/downward direction. The linear portion 15C is coupled to an approximately central portion of the linear portion 15A and extends in the upward/downward direction. The linear portion 15D is coupled to a right end portion of the linear portion 15A and extends in the upward/downward direction. Terminals 15B1 and 15B2 are disposed on both ends of the linear portion 15B. Terminals 15C1 and 15C2 are disposed on both ends of the linear portion 15C. Terminals 15D1 and 15D2 are disposed on both ends of the linear portion 15D.

The neutral terminals TN of the capacitor modules CM1, CM2, CM3, CM4, CM5, and CM6 are respectively fastened with screws and coupled to the terminals 15B1, 15C1, 15D1, 15B2, 15C2, and 15D2 of the bus bar 15.

The terminals T4c and T4d (see FIG. 9B, for example) of each of the capacitor modules CM1 to CM3 are fastened with screws and coupled to terminals 161 and 162 disposed at desired positions on a bus bar 16 coupled to a discharge circuit (not illustrated). Thus, the snubber capacitors SC of the capacitor modules CM1 to CM6 are coupled to the discharge circuit.

The terminals QT14 of the switch modules QM1a, QM1b, QM1c, QM2a, QM2b, and QM2c are respectively fastened with screws and coupled to the terminals 131, 132, 133, 134, 135, and 136 of the bus bar 13. Similarly, the terminals QT14 of the switch modules QM1d, QM1e, QM1f, QM2d, QM2e, and QM2f are fastened with screws and coupled to the bus bar 13. Also, the terminals QT14 of the switch modules QM1g, QM1h, QM1i, QM2g, QM2h, and QM2i are fastened with screws and coupled to the bus bar 13.

The terminal 137 of the bus bar 13 is coupled to the switch modules QM1a, QM1b, QM1c, QM2a, QM2b, and QM2c, and is fastened with screws and coupled to a terminal 141 of the bus bar 14. The terminal 137 of the bus bar 13 is coupled to the switch modules QM1d, QM1e, QM1f, QM2d, QM2e, and QM2f, and is fastened with screws and coupled to a terminal 142 of the bus bar 14. The terminal 137 of the bus bar 13 is coupled to the switch modules QM1g, QM1h, QM1i, QM2g, QM2h, and QM2i, and is fastened with screws and coupled to a terminal 143 of the bus bar 14.

Terminals 144, 145, and 146 of the bus bar 14 are respectively coupled to the U phase, the V phase, and the W phase of the load 4 through desired couplers (such as bus bars and cables).

Effects of this Embodiment

As has been described hereinbefore, the matrix convertor 1 according to this embodiment includes the plurality of first bidirectional switches Q1 and the plurality of second bidirectional switches Q2. The first bidirectional switches Q1 are coupled to the respective input phases of the AC power source 2 and the respective output phases of the load 4. The second bidirectional switches Q2 are respectively coupled to the same respective input phases and the same respective output phases as the first bidirectional switches Q1. The second bidirectional switches Q2 are coupled electrically in parallel to the first bidirectional switches Q1. By switching the first bidirectional switches Q1 and the second bidirectional switches Q2, the matrix convertor 1 converts AC power of the AC power source 2 into AC power of a desired voltage and frequency and outputs the converted AC power to the load 4.

Incidentally, a rated current suitable for each bidirectional switch Q is defined. The rated current for the matrix convertor 1 should not be increased beyond the rated current for the bidirectional switches Q. Thus, there is a limit on increase in the capacity of the matrix convertor 1.

In this embodiment, the plurality of bidirectional switches Q are coupled in parallel to the respective input phases of the AC power source 2 and the respective output phases of the load 4. This decreases the current flowing through each bidirectional switch Q (for example, in the case of parallel connection of two bidirectional switches Q, the current flowing through one of the two bidirectional switches Q is reduced by half). Consequently, while the current through the bidirectional switches Q is maintained to be equal to or lower than the rated current, the rated current for the matrix convertor 1 is significantly increased. This ensures maximized capacity of the matrix convertor 1.

In this embodiment, in particular, one or more groups (one in this embodiment) each including the second bidirectional switches Q2 equal in number to the first bidirectional switches Q1 are provided. Thus, by increasing the number of groups of the second bidirectional switches Q2, the capacity of the matrix convertor 1 is readily maximized.

In this embodiment, in particular, the plurality of first bidirectional switches Q1 are concentrated into one unit, whereas the plurality of second bidirectional switches Q2 are provided on a group basis. Thus, the capacity of the matrix convertor 1 is increased merely by increasing the number of groups of the second bidirectional switches Q2. This eliminates the need for changing existing switch arrangements. This, as a result, facilitates the increase in the capacity of the matrix convertor 1.

In this embodiment, in particular, the following advantageous effect is obtained. In the matrix convertor 1, current flows between the bidirectional switches coupled to the input phases through the AC capacitors. That is, as in this embodiment, when the number of input phases of the AC power source 2 is three (the R phase, the S phase, and the T phase), the current flows between the bidirectional switches Q of the R phase and the S phase, the bidirectional switches Q of the S phase and the T phase, and the bidirectional switches Q of the R phase and the T phase. Here, if wiring inductance between the bidirectional switches Q is large, surge voltage increases accordingly, which can make it impossible or difficult to increase the capacity. In this embodiment, since the bidirectional switches coupled to the input phases are mutually closely arranged, the wiring inductance between the bidirectional switches Q is reduced. This leads to an increase in current while suppressing an increase in the surge voltage, thereby facilitating the increase in the capacity of the matrix convertor 1.

In this embodiment, in particular, the plurality of first bidirectional switches Q1 and the plurality of second bidirectional switches Q2 coupled to one of the output phases are arranged to form one switch train in the upward/downward direction. This decreases the width of the matrix convertor 1.

In this embodiment, in particular, the coolant duct 120 is provided for the coolant to flow in the upward/downward direction. Thus, in the coolant duct 120, the coolant flows in the direction perpendicular to the right/left direction in which the plurality of first bidirectional switches Q1 and the plurality of second bidirectional switches Q2 coupled to one of the input phases (the R phase or the S phase or the T phase) are disposed. As a result, the heat of the bidirectional switches Q is conducted to the heat sinks 190a to 190c more uniformly in the direction of the coolant flow. This improves cooling efficiency.

In this embodiment, in particular, the following advantageous effect is obtained. As described above, in the matrix convertor 1, current flows between the bidirectional switches Q coupled to the input phases through the AC capacitors. Here, if wiring inductance between the AC capacitors is large, surge voltage increases accordingly, which can make it impossible or difficult to increase the capacity. In this embodiment, since the plurality of AC capacitors corresponding to the bidirectional switches Q coupled to the input phases are housed in the single module cover MC, the AC capacitors are mutually closely arranged. Thus, the wiring inductance between the AC capacitors is decreased to increase the current while suppressing an increase in the surge voltage. This, as a result, facilitates the increase in the capacity of the matrix convertor 1. The AC capacitors are modularized according to groups of the input phases (the R phase, the S phase, and the T phase). Consequently, in increasing the capacity of the matrix convertor 1, it is only necessary to add capacitor modules CM for the output phases (the U phase, the V phase, and the W phase) of a newly added group of second bidirectional switches Q2. This further facilitates the increase in the capacity of the matrix convertor 1.

In this embodiment, the capacitor module CM includes the terminals T1, T2, T3, T4a, T4b, T5a, T5b, T6a, and T6b, which protrude from the bottom surfaces bs1 and bs2 of the module cover MC. These terminals T1, T2, T3, T4a, T4b, T5a, T5b, T6a, and T6b function as support members to make the capacitor module CM stand on its own on the plurality of bidirectional switches Q. As a result, since the bidirectional switches Q and the AC capacitors are mutually closely arranged, the wiring inductance between the bidirectional switches Q and the AC capacitors is decreased. This ensures an increase in current while eliminating or minimizing an increase in the surge voltage. This, as a result, facilitates the increase in the capacity of the matrix convertor 1. The terminals T1, T2, T3, T4a, T4b, T5a, T5b, T6a, and T6b are disposed on the left and right sides of the module cover MC so as to make the capacitor module CM stably stand on its own, thereby enhancing installation strength.

In this embodiment, in particular, the capacitor module CM stands on its own using the terminals T1, T2, T3, T4a, T4b, T5a, T5b, T6a, and T6b. Thus, the capacitor module CM is disposed in a freestanding manner on the plurality of bidirectional switches Q using the terminals T1, T2, T3, T4a, T4b, T5a, T5b, T6a, and T6b so as to arrange the bidirectional switches Q and the AC capacitors mutually closely. This enhances reliability of reducing the wiring inductance between the bidirectional switches Q and the AC capacitors. Additionally, there is no need for securing members to secure the capacitor module CM, resulting in a reduction in piece-part count and cost. Further, it is not necessary to provide an insulation distance between securing members and the components, thereby reducing the size of the matrix convertor 1.

In this embodiment, in particular, the module cover MC houses the plurality of snubber capacitors SC respectively corresponding to the adjacent plurality of bidirectional switches Q in such a manner that the plurality of snubber capacitors SC are on the rear side of the plurality of AC capacitors. Thus, in increasing the capacity of the matrix convertor 1, it is only necessary to add capacitor modules CM for the output phases (the U phase, the V phase, and the W phase) of a newly added group of second bidirectional switches Q2. Thus, the AC capacitors and the snubber capacitors SC are added readily. This further facilitates the increase in the capacity of the matrix convertor 1. Since the snubber capacitors SC are arranged closer to the bidirectional switches Q than the AC capacitors are to the bidirectional switches Q, the effect of suppressing the surge voltage is improved.

In this embodiment, in particular, the following advantageous effect is obtained. There is a possibility of a potential difference between the capacitor modules CM in the same output phase due to various causes such as varied wiring arrangements of the bus bars. In this embodiment, current flows through the bus bar 15 coupling the neutral terminals TN of the capacitor modules CM1 to CM6. This decreases the potential difference and improves stability and reliability of operations of the matrix convertor 1.

In this embodiment, in particular, the module covers MC are made of resin. This ensures shortened insulation distances between the capacitor modules CM and the other components. This results in a high degree of freedom in the arrangement of the components. For example, the bus bars may be provided adjacent to the capacitor modules CM.

In this embodiment, in particular, the following advantageous effect is obtained. As described above, in the matrix convertor 1, current flows between the bidirectional switches Q of the R phase and the S phase, the bidirectional switches Q of the S phase and the T phase, and the bidirectional switches Q of the R phase and the T phase. In this embodiment, the laminate bus bar 11 included in the current path has a configuration in which the plate-shape bus bars 11A, 11B, and 11C coupled to the respective input phases are laminated. The laminate bus bar 12 included in the current path has the configuration in which the plate-shape bus bars 12A, 12B, and 12C coupled to the respective input phases are laminated. Thus, directions of magnetic fields generated on the two laminated bus bars when the current flows become opposite to each other and canceled by each other. This enhances the effect of decreasing the wiring inductance. This, in turn, further facilitates the increase in the capacity of the matrix convertor 1.

In this embodiment, in particular, the first bidirectional switches Q1 and the second bidirectional switches Q2 are coupled electrically in parallel to the identical input phase and the identical output phase. The length of the first signal wires W1 of the first bidirectional switches Q1 is equal to the length of the second signal wires W2 of the second bidirectional switches Q2. This ensures highly accurate synchronization and switching operations of the first bidirectional switches Q1 and the second bidirectional switches Q2 coupled electrically in parallel to the identical input phase and the identical output phase. Consequently, stability and reliability of the operations of the matrix convertor 1 are improved.

In this embodiment, in particular, the capacitor module CM includes the input-output terminals T1, T2, and T3 of the AC capacitor units AC and the input-output terminals T4a, T4b, T5a, T5b, T6a, and T6b of the snubber capacitors SC. The input-output terminals T1, T2, and T3 are located on the right side of the module cover MC. The input-output terminals T4a, T4b, T5a, T5b, T6a, and T6b are located on the left side of the module cover MC. The bidirectional switches Q include the terminals QT13 and QT14 on the right side and the terminals QT11 and QT12 on the left side. The terminals QT13 and QT14 are input-output terminals of the AC capacitors. The terminals QT11 and QT12 are input-output terminals of the snubber capacitors SC. This configuration enables the capacitor module CM to stand on its own on the bidirectional switches Q while being supported by the plurality of terminals T1, T2, T3, T4a, T4b, T5a, T5b, T6a, and T6b as support members.

In this embodiment, in particular, the capacitor module CM includes the input-output terminals T4c, T4d, T5c, and T5d of the snubber capacitors SC located on the upper and lower sides of the module cover MC. These input-output terminals T4c, T4d, T5c, and T5d are used as terminals to couple the snubber capacitors SC of the capacitor modules CM to each other and to couple the snubber capacitors SC to the discharge circuit. Also, the terminals are located on four sides of the module cover MC. This ensures that, in this embodiment, where the input-terminals T4c, T4d, T5c, and T5d are arranged to enable the capacitor module CM to stand on its own, freestanding stability and installation strength of the capacitor module CM are further enhanced.

In this embodiment, in particular, the module cover MC has a length corresponding to the plurality of bidirectional switches Q aligned with each other. Thus, the AC capacitors and the snubber capacitors SC are disposed immediately above the corresponding bidirectional switches Q. This decreases the wiring inductance between the bidirectional switches Q and the AC capacitors or the snubber capacitors SC. This also facilitates visual confirmation of the relationship of correspondence between the capacitor module CM and the bidirectional switches Q.

As used herein, the terms "perpendicular", "parallel", and "plane" may not necessarily mean "perpendicular", "parallel", and "plane", respectively, in a strict sense. Specifically, the terms "perpendicular", "parallel", and "plane" mean "approximately perpendicular", "approximately parallel", and "approximately plane", respectively, taking design-related and production-related tolerance and error into consideration.

Also, when the terms "same", "equal", and "different" are used in the context of dimensions or sizes of external appearance, these terms may not necessarily mean "same", "equal", and "different", respectively, in a strict sense. Specifically, the terms "same", "equal", and "different" mean "approximately same", "approximately equal", and "approximately different", respectively, taking design-related and production-related tolerance and error into consideration.

Otherwise, the above-described embodiments and modifications may be combined in any manner deemed suitable.

Obviously, numerous modifications and variations of the present disclosure are possible in light of the above teachings. It is therefore to be understood that within the scope of the appended claims, the present disclosure may be practiced otherwise than as specifically described herein.

What is claimed as new and desired to be secured by Letters Patent of the United States is:

1. A capacitor module applicable in a matrix convertor, the capacitor module comprising:
    a module cover housing a plurality of AC capacitors; and
    a plurality of terminals disposed at least on a first side and a second side of the module cover in a widthwise direction of the module cover and protruding from first and second parallel bottom surfaces of the module cover,
    wherein the capacitor module is configured to stand on its own by the plurality of terminals on respective bottom surfaces of each of the plurality of terminals that collectively support an entirety of the capacitor module.

2. The capacitor module according to claim 1, wherein the module cover houses a plurality of snubber capacitors.

3. The capacitor module according to claim 2, wherein the module cover houses the plurality of snubber capacitors at a position closer to the second bottom surface than the plurality of AC capacitors are to the second bottom surface.

4. The capacitor module according to claim 3, wherein the plurality of terminals comprise
    first input-output terminals respectively of the plurality of AC capacitors, the first input-output terminals being disposed on the first side of the module cover and respectively coupled to bidirectional switches, and
    second input-output terminals respectively of the plurality of snubber capacitors, the second input-output terminals being disposed on the second side of the module cover and respectively coupled to the bidirectional switches.

5. The capacitor module according to claim 4, wherein the plurality of terminals comprise third input-output terminals respectively of the snubber capacitors, the third input-output terminals being disposed on a third side and a fourth side of the module cover in a longitudinal direction of the module cover perpendicular to the widthwise direction.

6. The capacitor module according to claim 2, further comprising a neutral terminal disposed on a side surface of the module cover and coupled to a neutral point of connection of the plurality of AC capacitors.

7. The capacitor module according to claim 1, wherein the bottom surface of each of the plurality of terminals forms a weight-bearing bottom surface that is spaced from the second bottom surface of the module cover by a non-zero distance in a direction orthogonal to the widthwise direction.

8. The capacitor module according to claim 7, wherein the weight-bearing bottom surfaces of the plurality of terminals each extends substantially parallel to the first and second bottom surfaces of the module cover.

9. The capacitor module according to claim 1,
    wherein a first terminal of the plurality of terminals is disposed on the first side and protrudes from the first bottom surface of the module cover and a second terminal of the plurality of terminals is disposed on the second side and protrudes from the second bottom surface of the module cover, and
    wherein the first bottom surface of the module cover from which the first terminal protrudes is disposed at a different height than the second bottom surface of the module cover from which the second terminal protrudes.

10. The capacitor module according to claim 9, wherein the bottom surface of the first terminal is disposed at the same height as the height at which the bottom surface of the second terminal is disposed.

11. The capacitor module according to claim 1, wherein the module cover includes a first container containing the plurality of AC capacitors and a second container containing a plurality of snubber capacitors such that the first container and the second container overlap each other in a first direction orthogonal to the widthwise direction and orthogonal to the first and second bottom surfaces.

12. A matrix convertor comprising:
    a plurality of first bidirectional switches respectively coupled to input phases of an AC power source and respectively coupled to output phases of a load;
    a plurality of second bidirectional switches respectively coupled to the input phases of the AC power source and respectively coupled to the output phases of the load, the plurality of second bidirectional switches being coupled electrically in parallel to the plurality of first bidirectional switches; and capacitor modules respectively disposed on and above the plurality of first bidirectional switches in a first direction and on and above the plurality of second bidirectional switches in the first direction, the capacitor modules each comprising:

a module cover housing a plurality of AC capacitors; and a plurality of terminals disposed at least on a first side and a second side of the module cover in a widthwise direction of the module cover and protruding from a bottom surface of the module cover as measured in the first direction.

13. The matrix convertor according to claim 12, wherein the capacitor modules are respectively disposed directly above the plurality of first bidirectional switches in the first direction and directly above the plurality of second bidirectional switches in the first direction.

14. The matrix converter according to claim 12, wherein the module cover of each of the capacitor modules includes a first container containing the plurality of AC capacitors and a second container containing a plurality of snubber capacitors such that the first container and the second container overlap each other in the first direction, the first direction being orthogonal to the widthwise direction and orthogonal to the bottom surface.

15. A capacitor module applicable in a matrix convertor, the capacitor module comprising:

a module cover housing a plurality of AC capacitors; and a plurality of terminals, including at least a positive terminal and a negative terminal, disposed at least on a first side and a second side of the module cover in a widthwise direction of the module cover and protruding from a bottom surface of the module cover to make the capacitor module stand on its own, wherein the module cover houses a plurality of snubber capacitors at a position in the module cover closer to the bottom surface of the module cover from which the plurality of terminals protrude than the plurality of AC capacitors, and wherein the plurality of terminals comprise first input-output terminals respectively of the plurality of AC capacitors, the first input-output terminals being disposed on the first side of the module cover and respectively coupled to bidirectional switches, and second input-output terminals respectively of the plurality of snubber capacitors, the second input-output terminals being disposed on the second side of the module cover and respectively coupled to the bidirectional switches.

16. The capacitor module according to claim 15, wherein the plurality of terminals comprise third input-output terminals respectively of the snubber capacitors, the third input-output terminals being disposed on a third side and a fourth side of the module cover in a longitudinal direction of the module cover perpendicular to the widthwise direction.

17. The capacitor module according to claim 15, further comprising a neutral terminal disposed on a side surface of the module cover and coupled to a neutral point of connection of the plurality of AC capacitors.

18. The capacitor module according to claim 15, wherein the module cover includes a first container containing the plurality of AC capacitors and a second container containing the plurality of snubber capacitors such that the first container and the second container overlap each other in a first direction orthogonal to the widthwise direction and orthogonal to the bottom surface.

19. A capacitor module applicable in a matrix convertor, the capacitor module comprising:

a module cover housing a plurality of AC capacitors; and a plurality of terminals disposed at least on a first side and a second side of the module cover in a widthwise direction of the module cover and protruding from a bottom surface of the module cover, wherein the module cover houses a plurality of snubber capacitors at a position in the module cover closer to the bottom surface of the module cover from which the plurality of terminals protrude than the plurality of AC capacitors, and wherein the plurality of terminals comprise first input-output terminals respectively of the plurality of AC capacitors, the first input-output terminals being disposed on the first side of the module cover and respectively coupled to bidirectional switches, and second input-output terminals respectively of the plurality of snubber capacitors, the second input-output terminals being disposed on the second side of the module cover and respectively coupled to the bidirectional switches.

20. The capacitor module according to claim 19, wherein the plurality of terminals comprise third input-output terminals respectively of the snubber capacitors, the third input-output terminals being disposed on a third side and a fourth side of the module cover in a longitudinal direction of the module cover perpendicular to the widthwise direction.

21. The capacitor module according to claim 19, further comprising a neutral terminal disposed on a side surface of the module cover and coupled to a neutral point of connection of the plurality of AC capacitors.

22. The capacitor module according to claim 19, wherein the module cover comprises a resin.

23. The capacitor module according to claim 19, wherein the plurality of AC capacitors housed in the module cover respectively correspond to the bidirectional switches which are coupled to input phases of an AC power source on a side of an output phase of a load.

24. The capacitor module according to claim 23, wherein the module cover comprises a length corresponding to the plurality of bidirectional switches aligned with each other.

25. The capacitor module according to claim 19, wherein the capacitor module is configured to stand on its own by the plurality of terminals.

26. The capacitor module according to claim 19, wherein the module cover includes a first container containing the plurality of AC capacitors and a second container containing the plurality of snubber capacitors such that the first container and the second container overlap each other in a first direction orthogonal to the widthwise direction and orthogonal to the bottom surface.

* * * * *